(12) United States Patent
Ross et al.

(10) Patent No.: US 10,834,838 B1
(45) Date of Patent: Nov. 10, 2020

(54) COLLAPSIBLE AND EXPANDABLE DATA CENTER INFRASTRUCTURE MODULES

(71) Applicant: Amazon Technologies, Inc., Seattle, WA (US)

(72) Inventors: Peter George Ross, Olympia, WA (US); Robert David Wilding, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/218,328

(22) Filed: Dec. 12, 2018

(51) Int. Cl.
H05K 7/00 (2006.01)
H05K 5/02 (2006.01)
H05K 7/18 (2006.01)

(52) U.S. Cl.
CPC ......... *H05K 5/0256* (2013.01); *H05K 5/0204* (2013.01); *H05K 7/18* (2013.01)

(58) Field of Classification Search
USPC .......................................................... 361/728
See application file for complete search history.

(56) References Cited

U.S. PATENT DOCUMENTS

| 7,430,118 | B1 | 9/2008 | Noteboom et al. |
| 8,238,082 | B2 | 8/2012 | Salpeter |
| 9,332,670 | B1 | 5/2016 | Eichelberg |
| 9,357,681 | B2 | 5/2016 | Ross et al. |
| 2006/0139877 | A1 | 6/2006 | Germagian |
| 2007/0165377 | A1 | 7/2007 | Rasmussen |
| 2008/0024977 | A1 | 1/2008 | Coglitore |
| 2008/0174954 | A1 | 7/2008 | VanGilder |
| 2008/0180908 | A1 | 7/2008 | Wexler |
| 2009/0061755 | A1 | 3/2009 | Calder |
| 2009/0086434 | A1 | 4/2009 | Hodes |
| 2009/0122484 | A1 | 5/2009 | Caveney |
| 2009/0251860 | A1 | 10/2009 | Belady |
| 2010/0003911 | A1 | 1/2010 | Graczyk et al. |
| 2010/0149754 | A1 | 6/2010 | Chapel |
| 2010/0223085 | A1 | 9/2010 | Gauthier |

(Continued)

FOREIGN PATENT DOCUMENTS

WO    2004049773    6/2004

OTHER PUBLICATIONS

AK, "Drive-In Pallet Rack Systems", downloaded May 21, 2014, pp. 1-2.

(Continued)

*Primary Examiner* — Hung S. Bui
(74) *Attorney, Agent, or Firm* — Robert C. Kowert; Kowert, Hood, Munyon, Rankin & Goetzel, P.C.

(57) ABSTRACT

A data center infrastructure module enables multiple data center infrastructure systems to be simultaneously installed in a data center (as opposed to sequentially installing the respective data center infrastructure systems). The data center infrastructure module includes a collapsible frame and one or more data center infrastructure system components coupled to the collapsible frame. The data center infrastructure module may be pre-assembled remotely from a data center location and may be transported to the data center location in a collapsed state. At the data center location, the pre-assembled data center infrastructure module may be expanded and installed between self-standing frames.

21 Claims, 23 Drawing Sheets

(56) References Cited

U.S. PATENT DOCUMENTS

| | | |
|---|---|---|
| 2010/0263830 A1 | 10/2010 | Noteboom |
| 2011/0063778 A1 | 3/2011 | Brouillard |
| 2011/0128699 A1 | 6/2011 | Heydari |
| 2011/0223849 A1 | 9/2011 | Ishimine et al. |
| 2011/0242755 A1 | 10/2011 | Zeighami |
| 2012/0063082 A1 | 3/2012 | Chang |
| 2012/0063087 A1 | 3/2012 | Wei |
| 2012/0162883 A1 | 6/2012 | Jai |
| 2012/0200206 A1 | 8/2012 | Schmitt |
| 2012/0243157 A1 | 9/2012 | Chen |
| 2012/0274193 A1 | 11/2012 | Qin |
| 2012/0274194 A1 | 11/2012 | Qin |
| 2013/0062475 A1* | 3/2013 | Lin .......................... H05K 7/18 248/65 |
| 2013/0120931 A1 | 5/2013 | Sankar |
| 2013/0138253 A1 | 5/2013 | Chainer |
| 2013/0286587 A1 | 10/2013 | Martini |
| 2014/0033751 A1 | 2/2014 | Bailey et al. |
| 2015/0041420 A1* | 2/2015 | Zelek ..................... A47B 43/00 211/149 |

OTHER PUBLICATIONS

Global, "Everything You Need to Know About Pallet Racks", downloaded May 21, 2014, pp. 1-3.

AK, "Pallet Rack Stocking Distributor", downloaded May 21, 2014, pp. 1-3.

U.S. Appl. No. 15/167,742, filed May 27, 2016, Peter George Ross et al.

U.S. Appl. No. 16/368,713, filed Mar. 3, 2019, Mayankant Madhavkant.

* cited by examiner

US 10,834,838 B1

COLLAPSIBLE AND EXPANDABLE DATA CENTER INFRASTRUCTURE MODULES

BACKGROUND

Organizations such as on-line retailers, Internet service providers, search providers, financial institutions, universities, and other computing-intensive organizations often conduct computer operations from large scale computing facilities. Also, such organizations, or smaller organizations, may outsource computer operations to a computing or storage service provider that operates large scale computing facilities. Such large scale computing facilities house and accommodate a large amount of server, network, and additional computer equipment to process, store, and exchange data. Typically, a computer room of a computing facility includes many server racks organized into rows with aisles between the rows of server racks. Each server rack, in turn, includes many servers and/or other associated computer equipment.

The amount of computing capacity needed for any given facility, such as a data center, may change rapidly as business needs dictate. Most often, there is a need for increased capacity at a data center location. Initially providing computing or storage capacity in a facility, such as a data center, or expanding the existing capacity of a facility (in the form of additional servers, for example), is resource-intensive and may take many months to implement. Substantial amounts of time and skilled labor are typically required to design and build data center infrastructure (or expand data center infrastructure). Often data center infrastructure is installed on-site, wherein data center infrastructure components are installed sequentially by different specialized craftspeople.

BRIEF DESCRIPTION OF THE DRAWINGS

FIG. 8B also illustrates trolleys of a collapsible and expandable data center infrastructure module engaged with the guides of the frame structure, according to some embodiments.

FIG. 8C also illustrates low-friction bumpers of a collapsible and expandable data center infrastructure module engaged with the guides of the frame structure, according to some embodiments.

Figure 1A:
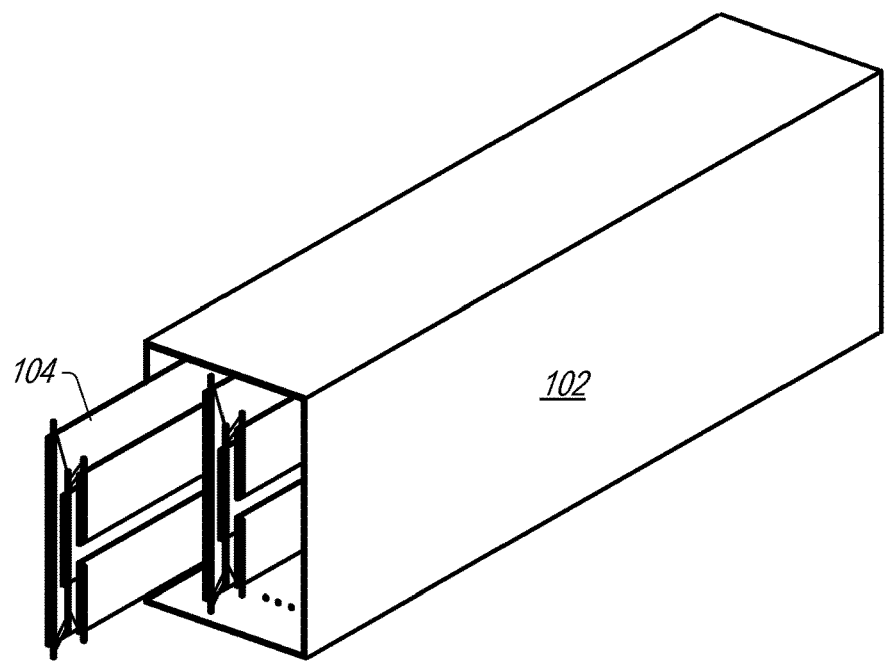
FIG. 1A illustrates a perspective view of collapsible and expandable data center infrastructure modules in a collapsed state and loaded in a shipping container, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of collapsible and expandable data center infrastructure modules are disclosed. Also methods of installing collapsible and expandable data center infrastructure modules are disclosed, as well as arrangements of facilities that include collapsible and expandable data center infrastructure modules, such as data centers. For simplicity, a collapsible and expandable data center infrastructure module may be referred to herein simply as a data center infrastructure module, a pre-assembled data center infrastructure module, an expandable data center infrastructure module, or other similar descriptions.

According to one embodiment, a method of installing infrastructure at a data center includes receiving, at the data center, a pre-assembled data center infrastructure module, wherein the pre-assembled data center infrastructure module comprises a plurality of cable trays and a plurality of power busways coupled to a collapsible frame. The method further includes positioning the pre-assembled data center infrastructure module between respective frame structures for data center rows or aisles of the data center and expanding the pre-assembled data center infrastructure module. For example, the pre-assembled data center infrastructure module may be transported to a location of the data center in a collapsed or compacted state. For example, the pre-assembled data center infrastructure module may be collapsed to fit into a standardized shipping container, along with other collapsed pre-assembled data center infrastructure modules. Continuing the example, a collapsed pre-assembled data center infrastructure module may be removed from a standardized shipping container, as a unit, and positioned between self-standing frames for data center rows/aisles, such as frames for hot aisles. Continuing the example, the collapsed pre-assembled data center infrastructure module, while positioned between the frame structures for the rows/aisles, may be expanded horizontally and/or vertically. The method further includes securing the pre-assembled data center infrastructure module, that has been expanded, into a position between the respective frame structures such that the cable trays and power busways of the pre-assembled data center infrastructure module support the data center rows or aisles. For example, a power busway of a pre-assembled data center infrastructure module may be used to supply power to rack computing systems in a data center row supported by the pre-assembled data center infrastructure module. In a similar manner, other infrastructure components of infrastructure support systems, such as networking, fire suppression, lighting, building management control, air containment, air distribution, etc. components may be included in a pre-assembled data center infrastructure module and may be used to support data center rows or aisles associated with the pre-assembled data center infrastructure module.

According to one embodiment, a data center infrastructure module comprises a collapsible frame, a first set of data center infrastructure components coupled to the collapsible frame and a second set of data center infrastructure components coupled to the collapsible frame. The data center infrastructure module is configured to be transported to a data center location as a pre-assembled unit in a collapsed state and is configured to be expanded at the data center location into an expanded state, such that the expanded data center infrastructure module provides a plurality of types of data center infrastructure support to a data center row or aisle at the data center location.

According to one embodiment, a facility, such as a data center, includes frame structures for data center rows on either side of a data center aisle and a data center infrastructure module positioned in the data center aisle between the frame structures. The data center infrastructure module includes a collapsible frame and one or more sets of data center infrastructure components coupled to the collapsible frame. Also, the data center infrastructure module is configured to be transported to or from the position in the data center aisle between the frame structures in a collapsed state and is configured to be expanded into an expanded state such that in the expanded state the data center infrastructure module provides data center infrastructure support to the data center rows of the data center on either side of the data center aisle.

As used herein, an "aisle" means a space next to one or more racks, such as a space between rows of racks. An "aisle" may be a "hot aisle" that encompasses a space between rows of racks that receives air that has been heated by heat producing components of computing devices in the rows of racks. Also, an aisle may be a "cold aisle" that encompasses a space between rows of racks that is provided cool air to be passed through computing devices in the rows of racks to remove heat from heat producing components in the computing devices. Also, an aisle may be a space or walkway in a data center that connects other aisles, such as an aisle running perpendicular to a plurality of cold aisles. In some embodiments, an aisle may be between a row of racks and a wall of data center, such as a first or last aisle of a set of aisles in a computing room.

As used herein, "computing" includes any operations that can be performed by a computer, such as computation, data storage, data retrieval, or communications.

As used herein, "computing system" includes any of various computer systems or components thereof. One example of a computing system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). As used herein a "computing system" may also refer to data storage systems, such as storage servers, as well as networking systems, such as routers, switches, etc.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, a "space" means a space, area or volume.

As used herein, a "module" is a component or a combination of components physically coupled to one another. A module may include functional elements and systems, such as power distribution systems, networking systems, fire suppression systems, and/or control systems, as well as structural elements, such a frame, housing, structure, container, etc. In some embodiments, a module is pre-assembled at a location off-site from a data center.

Typically data center infrastructure is installed in a data center prior to rack computing devices being installed in the data center. Also, typically the data center infrastructure is assembled on site at the data center by various skilled workers, wherein the workers complete tasks sequentially. For example, a first group of skilled workers may install framing and another group of skilled workers, such as electricians, may install power busways. Yet another group of skilled workers may install lighting. Additionally, other groups of skilled workers may install cable trays, networking cables, fire suppression systems, building management systems, air containment systems, air distribution systems, etc. Since there is a limited amount of space in a data center for multiple groups of skilled workers to simultaneously complete various tasks, different groups of skilled workers typically complete tasks after previous groups of skilled workers have completed earlier tasks while other groups of skilled workers wait on a current group of skilled workers to finish tasks currently being performed. The tasks to be completed by each set of workers forms a "critical path" for the completion of the data center, wherein tasks in the critical path add to the overall amount of time required to complete construction and commissioning of the data center. When tasks can be completed ahead of time or concurrently with other tasks, the critical path may be shortened, meaning that the completion and commissioning of the data center may be performed in a shorter amount of time.

In some embodiments, a critical path for construction and commissioning of a data center may be significantly shortened by using pre-assembled data center infrastructure modules to provide data center infrastructure support to rows of racks and aisles between the rows of racks. For example, pre-assembled data center infrastructure modules may be fabricated off-site from a data center location. Also, the pre-assembled data center infrastructure modules may be fabricated outside of the critical path timeline. For example, a pre-assembled data center infrastructure module may be fabricated prior to construction of a data center or in parallel with other activities involved in constructing a data center. In some embodiments, the use of pre-assembled data center infrastructure modules may shorten a critical path for construction of a data center. Also, efficiencies of scale may be realized wherein several data center row infrastructure modules are fabricated off-site using an assembly line or other manufacturing techniques.

In some embodiments, pre-assembled data center infrastructure modules may be re-used, thus reducing waste. For example, in some embodiments, a pre-assembled data center infrastructure module may be relocated from a data center that is being de-commissioned to a new or other data center for re-use in the new or other data center.

In some embodiments, a pre-assembled data center infrastructure module may be collapsible and expandable. For example, data center row infrastructure (e.g. assembled cable trays, power busways, etc.) takes up a large volume of space that is larger than most standardized shipping methods, such as ISO shipping containers. However, a collapsible frame of a data center infrastructure module may allow the data center infrastructure module to be collapsed such that the collapsed data center infrastructure module fits in a standardized shipping container, such as an ISO (International Standards Organization compliant) shipping container. Once at a data center location under construction, a collapsed data center infrastructure module may be removed from a standardized shipping container (after being transported to the data center location in the shipping container) and may be expanded and secured at the data center location to provide data center infrastructure support to rows of rack computers at the data center location and to aisles between the rows.

FIG. 1A illustrates a perspective view of collapsible and expandable data center infrastructure modules in a collapsed state and loaded in a shipping container, according to some embodiments.

In some embodiments, a shipping container, such as shipping container 102, may be used to transport, to a data center location, collapsible and expandable data center infrastructure modules, such as data center infrastructure modules 104. In some embodiments, a data center infrastructure module may have an expanded width of approximately 11 feet or more, an expanded height of approximately 7.5 feet or more, and a length of approximately 36 feet or more. However, in a collapsed state a pre-assembled data center infrastructure module be reduced to fit within a standard 40 foot long shipping container that has a height of 8.5 feet and a width of 8 feet. Also, the collapsed pre-assembled data center infrastructure module may be rotated on its side to fit within a shipping container and may be transported in the shipping container with one or more additional collapsed pre-assembled data center infrastructure modules.

At a data center location, a collapsed pre-assembled data center infrastructure module, such as data center infrastructure module 104, may be removed from a shipping container, such as shipping container 102, and may be rotated. Once rotated, the pre-assembled data center infrastructure module may be placed between self-standing frame structures.

Figure 1B:
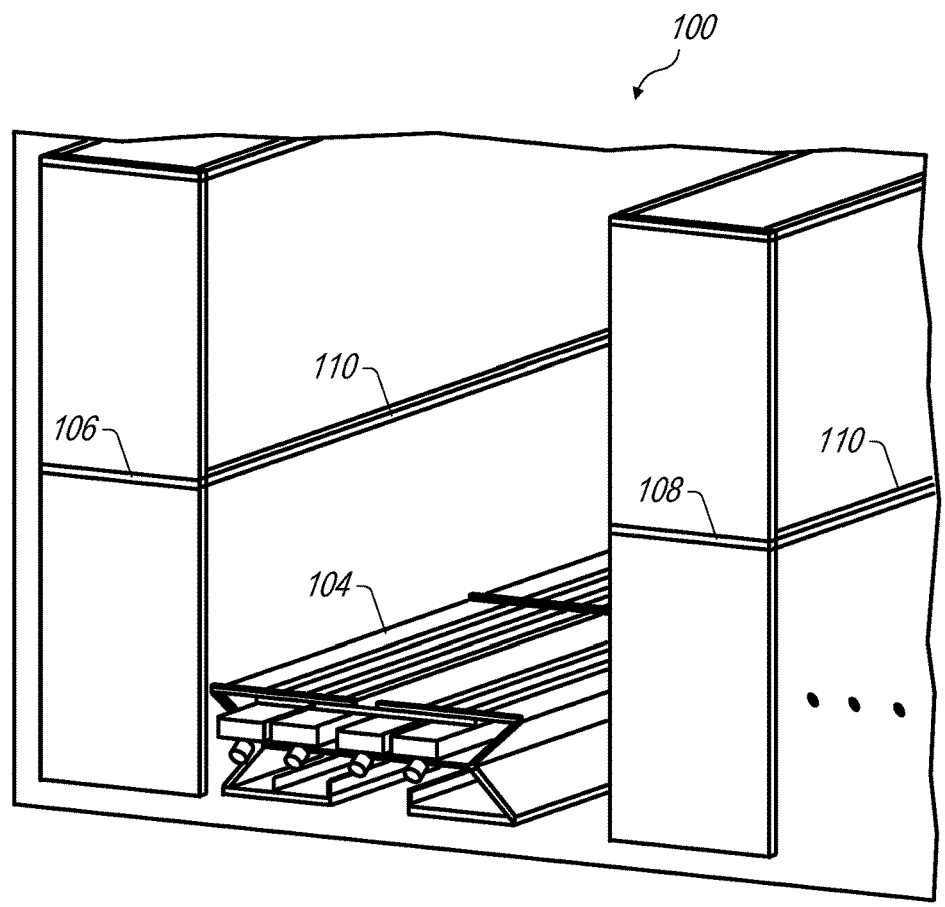
FIG. 1B illustrates a perspective view of a collapsible and expandable data center infrastructure module that has been positioned between frame structures for rows of a data center, according to some embodiments.

For example, FIG. 1B illustrates a perspective view of a collapsible and expandable data center infrastructure module that has been positioned between frame structures for rows of a data center, according to some embodiments.

Data center infrastructure module 104 has been positioned between self-standing frame 106 and self-standing frame 108 of data center 100. In some embodiments, racks comprising computing systems are subsequently placed beneath or adjacent to structural members 110 of self-standing frames 106 and 108. The racks may be organized in rows, wherein the space between the racks forms a cold aisle and the spaces encompassed by self-standing frames 106 and 108, respectively, form hot aisles. In some embodiments, a collapsed pre-assembled data center infrastructure module, such as data infrastructure module 104, may be expanded horizontally and/or vertically and secured to self-standing frames, such as self-standing frames 106 and 108, to provide data center infrastructure support to rows of rack computer systems installed in rows beneath or adjacent to the self-standing frames.

In some embodiments, pre-assembled data center infrastructure modules, such as data center infrastructure modules 104, may be pre-tested prior to being transported to a data center location. In some embodiments, testing may include testing fire-suppression systems for leaks, megger-testing power distribution systems for shorts, loop checking and labeling network cabling, etc. In some embodiments, each pre-assembled data center infrastructure module may be a discrete module that can be individually transported and mechanically re-expanded as needed. In some embodiments, data center infrastructure components of a data center infrastructure module may be prepared for shipping in a way that makes any damage incurred during shipping easily detectable. For example, pipes of a dry-pipe fire suppression system included in a pre-assembled data center infrastructure module may be pressurized prior to shipping. Thus, any potential leaks that may have developed due to damage incurred during shipping may be easily detectable by verifying that the pressurized pipes have not lost their pressure.

In some embodiments, a pre-assembled data center infrastructure module, such as one of data center infrastructure modules 104, may include rigging connections for use in moving or rotating the pre-assembled data center infrastructure module. In some embodiments, a pre-assembled data center infrastructure module may include shipping protector panels. In some embodiments, shipping protector panels may also serve as air containment panels when a pre-assembled data center infrastructure module is expanded into an expanded state and installed between frame structures of a data center. In some embodiments, shipping protector panels/air containment panels may be rigid panels connected via hinged joints, telescoping rigid panels, or collapsible non-rigid panels, such as fabric panels. Also, in some embodiments, a pre-assembled data center infrastructure module may further include shipping bracing elements to add torsional support for the pre-assembled data center infrastructure module, especially when the pre-assembled data center infrastructure module is being rotated when being inserted into a shipping container or when the pre-assembled data center infrastructure module is being rotated after being removed from a shipping container.

Figure 1C:
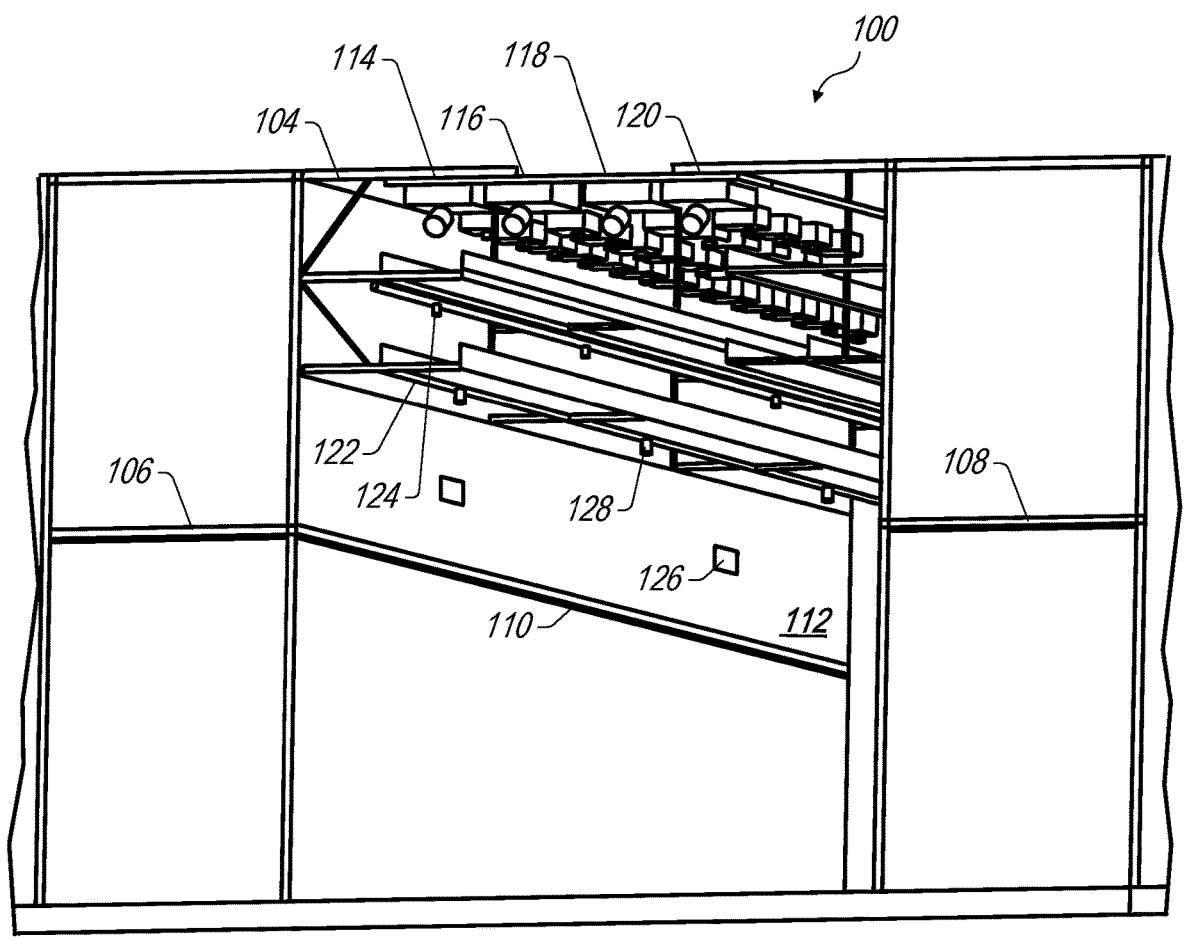
FIG. 1C illustrates a perspective view of a collapsible and expandable data center infrastructure module in an expanded state and secured in an elevated position to provide data center infrastructure, according to some embodiments.

FIG. 1C illustrates a perspective view of a collapsible and expandable data center infrastructure module in an expanded state and secured in an elevated position to provide data center infrastructure, according to some embodiments.

Data center 100 illustrated in FIG. 1C may be the same data center 100 as illustrated in FIG. 1B. In FIG. 1C, data center infrastructure module 104 has been expanded horizontally such that the data center infrastructure module 104 spans a length of space between self-standing frames 106 and 108. Also, data center infrastructure module 104 has been expanded vertically such that the side edges of the data center infrastructure module lay flat against the self-standing frames 106 and 108. Additionally, shipping protection panels/air containment panels 112 have been unfolded and positioned against the self-standing frames 106 and 108 such that the shipping protection panels/air containment panels 112 form an air containment barrier between respective hot aisles encompassed by self-standing frames 106 and 108, and a cold aisle between self-standing frames 106 and 108.

In the expanded state, a pre-assembled data center infrastructure module may provide various types of infrastructure support to rows and/or aisles associated with the deployed pre-assembled data center infrastructure module. For example, data center infrastructure module 104 includes primary power system distribution 114 and secondary power system distribution 116 that are configured to supply power to racks mounted adjacent to self-standing frame 106. Also, data center infrastructure module 104 also includes primary power system distribution 120 and secondary power system distribution 118 that are configured to supply power to racks mounted adjacent to self-standing frame 108. In some embodiments, primary power system distribution 114 and 120 and secondary power system distribution 116 and 118 may include power busways configured to distribution 1,000 amps, 2,000 amps, or another amount of electrical power.

In a similar manner, data center infrastructure module 104 includes networking cable trays 122 on either side of the pre-assembled data center infrastructure module to provide networking infrastructure for computing devices mounted in rows of racks associated with free-standing frames 106 and 108.

In some embodiments, data center infrastructure module 104 includes fire suppression infrastructure 124. In some embodiments, fire suppression infrastructure 124 may include pipes and/or sprinklers of a dry-pipe fire suppression system or other type of fire suppression system. In some embodiments, a fire suppression system may be a very early smoke detection apparatus (VESDA) system, and a pre-assembled data center infrastructure module, such as data center infrastructure module 104, may include early smoke detection sensors.

In some embodiments, data center infrastructure module 104 includes building management control system devices, such as temperature sensors, humidity sensors, smoke sensors, or other types of sensors. For example, data center infrastructure module 104 includes temperature sensors 126 mounted on air containment panels 112.

Additionally, in some embodiments, a pre-assembled data center infrastructure module, such as data center infrastructure module 104, may include other data center infrastructure components, such as lighting, air ducting, cooling fluid distribution infrastructure, etc. For example, data center infrastructure module 104 includes lights 128.

The various data center infrastructure components included in data center infrastructure module 104, for example as shown in FIG. 1C, may have been pre-installed in the data center infrastructure module at a fabrication facility and included in the data center infrastructure module 104 while being transported to data center 100, while being positioned in data center 100, while being expanded in data center 100, and while being secured at a final height in data center 100. By doing this, critical path steps for installing power distribution busways, installing cable trays, installing fire suppression systems, installing lighting systems, installing air containment systems, etc. may be consolidated into a single step of installing a pre-assembled data center infrastructure module. As mentioned above, this may reduce a critical path timeline for construction and commissioning of a data center.

Figure 2:
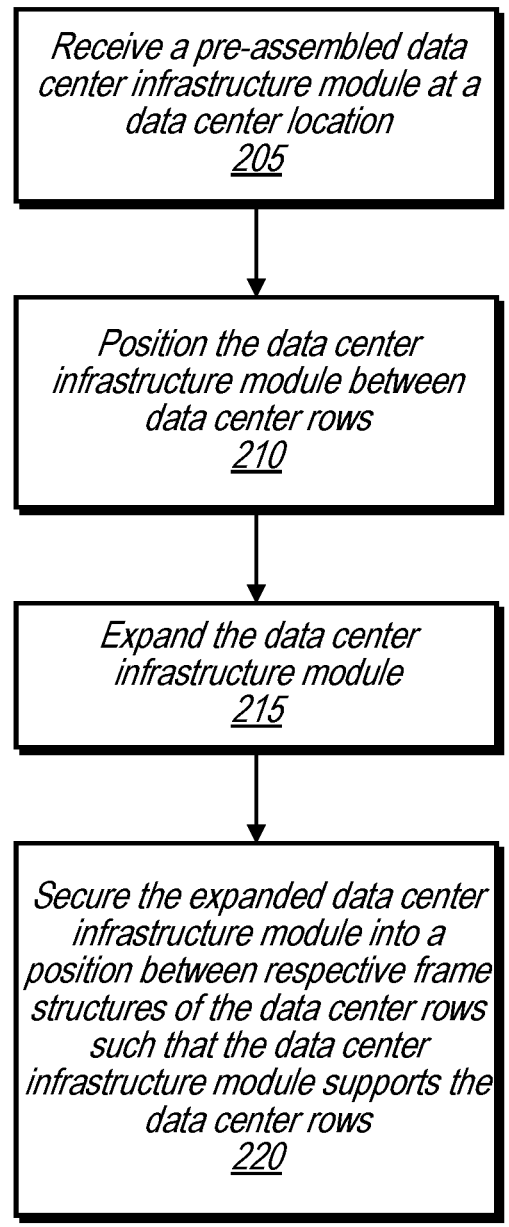
FIG. 2 illustrates a flow chart for installing data center infrastructure in a data center using collapsible and expandable data center infrastructure modules, according to some embodiments.

FIG. 2 illustrates a flow chart for installing data center infrastructure in a data center using collapsible and expandable data center infrastructure modules, according to some embodiments.

At 205, a pre-assembled data center infrastructure module is received at a data center location. The pre-assembled data center infrastructure module may have been transported to the data center location in a collapsed or compacted state, for example in a standard shipping container, such as an ISO shipping container.

At 210, the pre-assembled data center infrastructure module is removed from a shipping container and positioned in the data center between frame structures for data center rows. For example, a frame structure may encompass a hot aisle containment structure for a row of racks (and or another row of racks that abut the frame structure on an opposite side of the frame structure). In the data center, a space between the frame structure and another frame structure that may encompass a hot aisle containment structure for an opposing row of racks may be an open space that forms a walkway between the to be installed rows of racks and that forms a cold aisle for the to be installed rows of racks. The data center infrastructure module may be placed in this open space that forms the walkway and cold aisle between the opposing to be installed rows of racks.

At 215, the pre-assembled data center infrastructure module positioned between the frame structures for opposing rack rows, may be expanded. In some embodiments, the data center infrastructure module may have been collapsed both vertically and horizontally. In such embodiments, expanding the pre-assembled data center infrastructure module may include horizontally expanding the pre-assembled data center infrastructure module such that the expanded pre-assembled data center infrastructure module spans a length of space between the frames for the opposing rows of racks. Also, expanding the pre-assembled data center infrastructure module may include coupling the pre-assembled data center infrastructure module to the frames and vertically lifting the pre-assembled data center infrastructure module to expand the pre-assembled data center infrastructure module vertically.

At 220, the pre-assembled data center infrastructure module is secured at a final height to support the data center rows. In some embodiments, the pre-assembled data center infrastructure module may be further lifted vertically after being expanded vertically. The pre-assembled data center infrastructure module may then be secured at this final height.

Figure 3A:
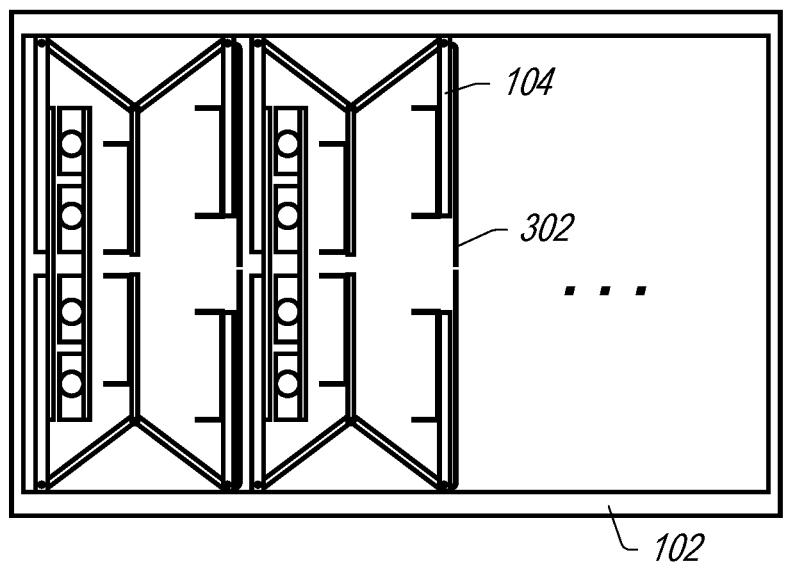
FIG. 3A illustrates a front view of a shipping container that stores a plurality of collapsible and expandable data center infrastructure modules in a collapsed state, according to some embodiments.

FIG. 3A illustrates a front view of a shipping container that stores a plurality of collapsible and expandable data center infrastructure modules in a collapsed state, according to some embodiments. Data center infrastructure modules 104 are rotated and positioned in shipping container 102. In some embodiments, a pre-assembled data center infrastructure module, such as data center infrastructure module 104, may include a shipping protection panel 302 that folds over a bottom side of the pre-assembled data center infrastructure module to protect the pre-assembled data center infrastructure module during shipping. As discussed in more detail in regard to FIG. 3F, the shipping protection panels 302 may fold out to also function as air containment panels.

In some embodiments, a pre-assembled data center infrastructure module, such as data center infrastructure module 104, includes a first type of data center infrastructure components coupled to a collapsible frame, such as power busways 306 coupled to collapsible frame 308. Also the pre-assembled data center infrastructure module, such as data center infrastructure module 104, includes a second type of data center infrastructure components coupled to the collapsible frame, such as cable trays 310 coupled to collapsible frame 308. In some embodiments, cable trays 310 may be populated with networking cables, such as fiber optic cables, prior to the pre-assembled data center infrastructure module being transported to a data center location. In other embodiments, cables may be installed in cable trays 310 at a data center location while the pre-assembled data center infrastructure module is elevated to a working height and before elevating the pre-assembled data center infrastructure module to a final height.

Figure 3B:
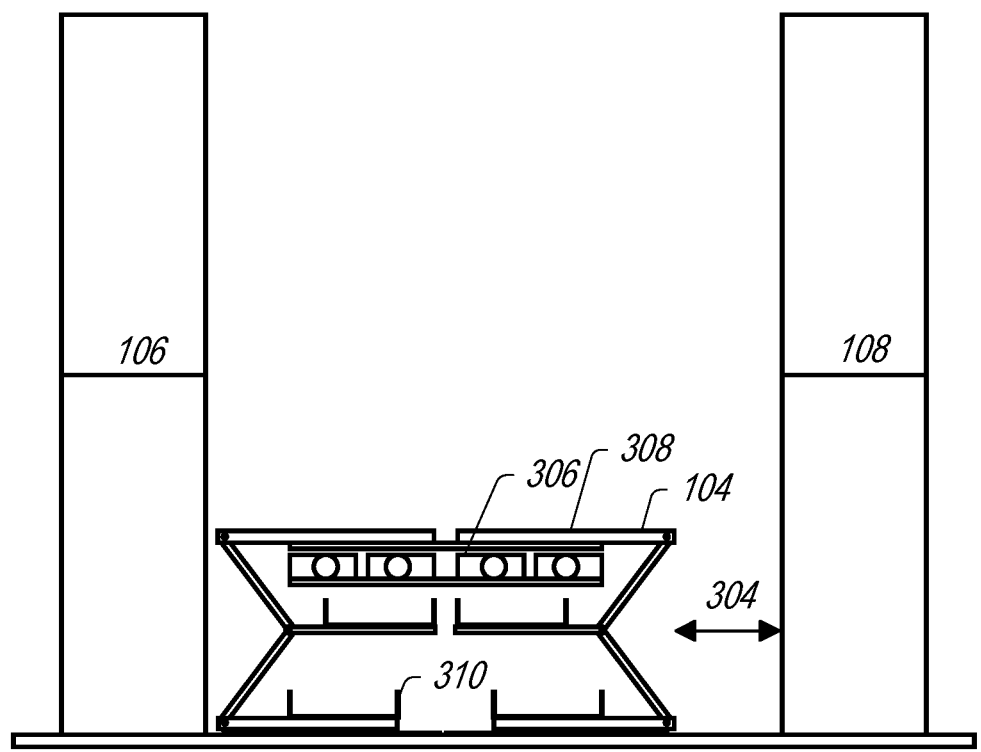
FIG. 3B illustrates a front view of a data center aisle between frame structures for data center rows, wherein a collapsible and expandable data center infrastructure module, in a collapsed state, has been positioned between the frame structures, according to some embodiments.

FIG. 3B illustrates a front view of a data center aisle between frame structures for data center rows, wherein a collapsible and expandable data center infrastructure module, in a collapsed state, has been positioned between the frame structures, according to some embodiments.

As can be seen, prior to expansion a pre-assembled data center infrastructure module, such as data center infrastructure module 104, may be positioned between frame structures 106 and 108, but may not span a full length of the space between frame structures 106 and 108, thus leaving a gap 304.

Figure 3C:
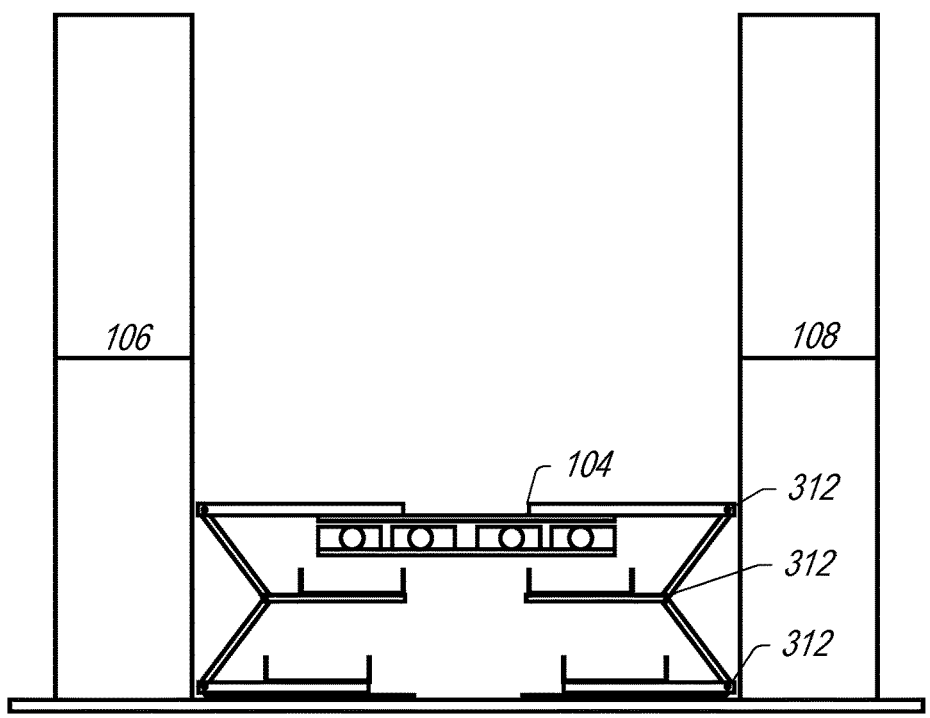
FIG. 3C illustrates a front view of a data center aisle between frame structures for data center rows, wherein a collapsible and expandable data center infrastructure module positioned between the frame structures has been horizontally expanded, according to some embodiments.

FIG. 3C illustrates a front view of a data center aisle between frame structures for data center rows, wherein a collapsible and expandable data center infrastructure module positioned between the frame structures has been horizontally expanded, according to some embodiments.

As shown in FIG. 3C, a pre-assembled data center infrastructure module, such as data center infrastructure module 104, may be horizontally expanded to close a gap between the pre-assembled data center infrastructure module and respective frame structures on either side of the pre-assembled data center infrastructure module. For example, data center infrastructure module 104 has been expanded in FIG. 3C to close gap 304.

In some embodiments, once expanded horizontally, a pre-assembled data center infrastructure module, such as data center infrastructure module 104, may be coupled to frames 106 and 108 to guide the pre-assembled data center infrastructure module while lifting the pre-assembled data center infrastructure module.

Figure 3D:
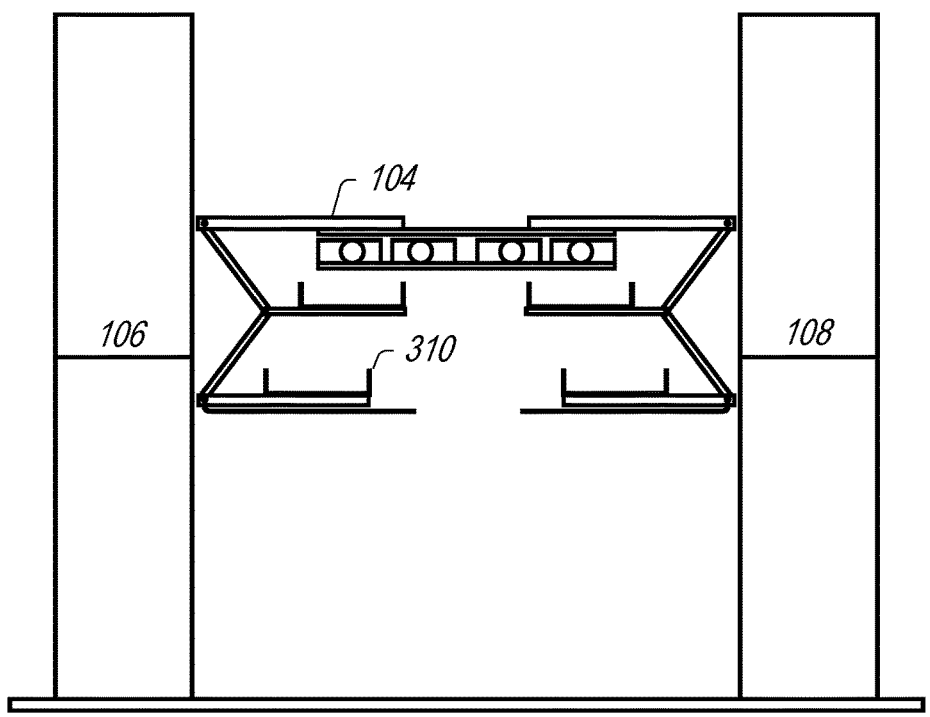
FIG. 3D illustrates a front view of a data center aisle between frame structures for data center rows, wherein a collapsible and expandable data center infrastructure module positioned between the frame structures has been elevated to a working height, according to some embodiments.

FIG. 3D illustrates a front view of a data center aisle between frame structures for data center rows, wherein a collapsible and expandable data center infrastructure module positioned between the frame structures has been elevated to a working height, according to some embodiments.

In FIG. 3D, data center infrastructure module 104 has been lifted to a working height. At the working height, the data center infrastructure module 104 may be vertically expanded into a fully expanded state as shown in FIG. 3E.

In some embodiments, a pre-assembled data center infrastructure module, such as data center infrastructure module 104, may include hinges 312 that enable the pre-assembled data center infrastructure module to collapse vertically and expand vertically. In some embodiments, a flexible seal may be placed over hinges 312, such as a flexible fabric or rubber strip. The flexible seal may prevent air from leaking through the hinged portion of the pre-assembled data center infrastructure module, while still allowing the pre-assembled data center infrastructure module to collapse and expand in a vertical direction. In some embodiments, hinges may be spaced along an edge of a collapsible frame of a pre-assembled data center infrastructure module, and a flexible seal may extend along a length of the frame that includes the hinges and spaces between the hinges.

Figure 3E:
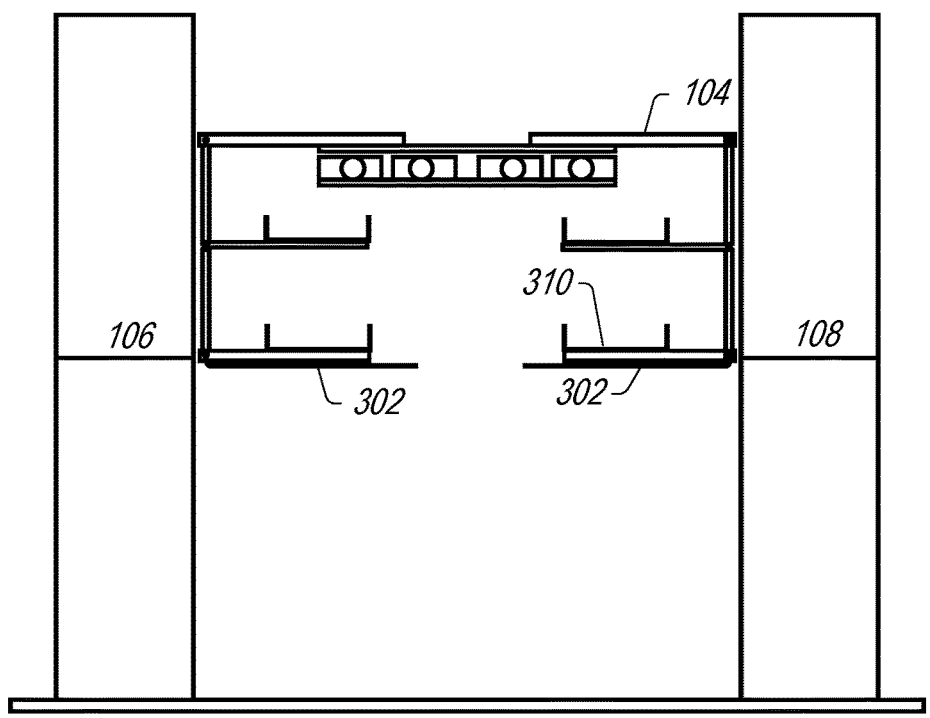
FIG. 3E illustrates a front view of a data center aisle between frame structures for data center rows, wherein a collapsible and expandable data center infrastructure module positioned between the frame structures has been vertically expanded, according to some embodiments.

FIG. 3E illustrates a front view of a data center aisle between frame structures for data center rows, wherein a collapsible and expandable data center infrastructure module positioned between the frame structures has been vertically expanded, according to some embodiments.

In some embodiments, various final connections may be made while a pre-assembled data center infrastructure module is elevated to a working height. For example, power and network connections to respective racks or rack rows on either side of the pre-assembled data center infrastructure module may be completed. In some embodiments, wherein a pre-assembled data center infrastructure module is shipped without pre-installed networking cables, the networking cables may be installed in cable trays 310 while the pre-assembled data center infrastructure module is elevated to the working height. In some embodiments, final connections may be completed at a working height without the need for a scissor lift, ladder, or other platform.

Figure 3F:
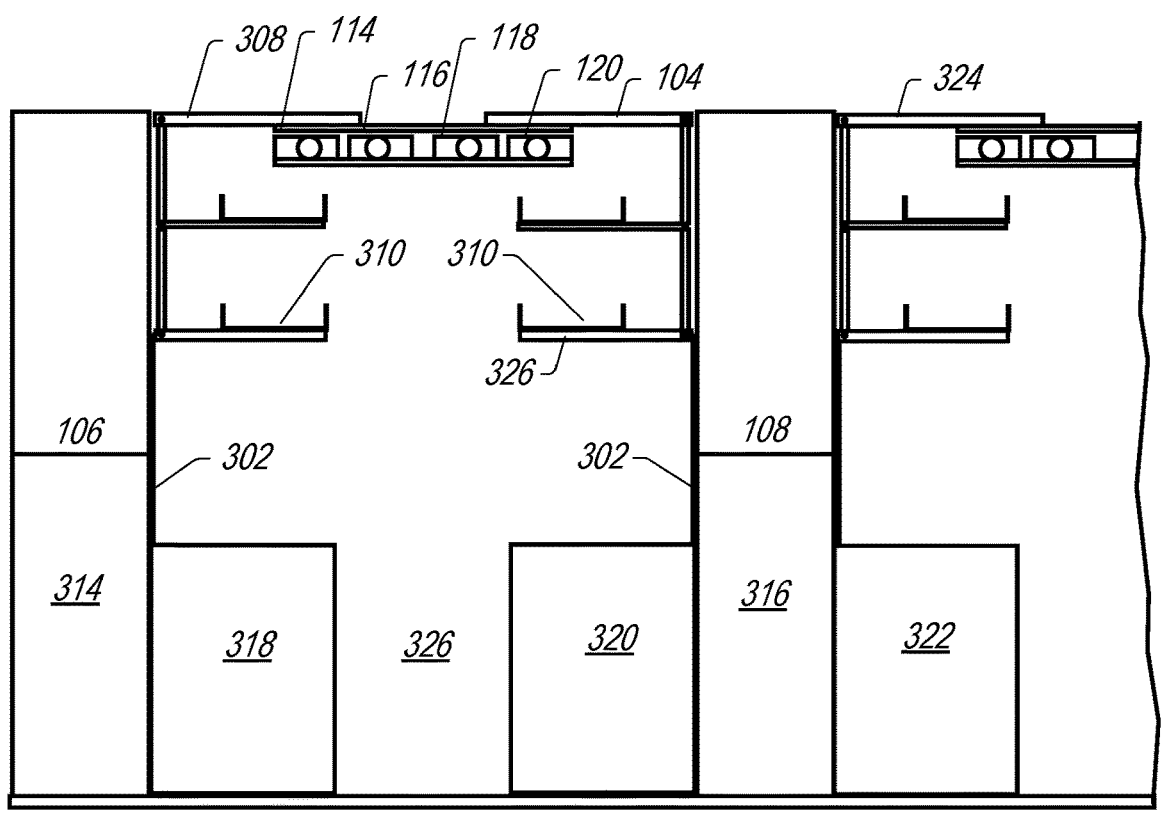
FIG. 3F illustrates a front view of a data center aisle between frame structures for data center rows, wherein a collapsible and expandable data center infrastructure module positioned between the frame structures has been further elevated to a final height, according to some embodiments.

FIG. 3F illustrates a front view of a data center aisle between frame structures for data center rows, wherein a collapsible and expandable data center infrastructure module positioned between the frame structures has been further elevated to a final height, according to some embodiments.

In some embodiments, once elevated to a final height, shipping protection panels/air containment panels 302 may be folded down such that the shipping protection panels/air containment panels 302 are flush with frame structures 106 and 108, and such that the shipping protection panels/air containment panels 302 provide air containment between a cold aisle 326 between frame structures 106 and 108 and hot aisles 314 and 316 encompassed within frame structures 106 and 108. In some embodiments, racks 318 and 320 may be positioned in cold aisle 326 such that heated air that has removed waste heat from heat producing components mounted in the racks 318 and 320 is exhausted into hot aisles 314 and 316 which are enclosed within frame structures 106 and 108. In some embodiments, additional panels may be mounted on frame structures 106 and 108 to enclose hot aisles 318 and 320.

In some embodiments, an additional data center infrastructure module 324 may be mounted on another side of frame structure 108 (and between another frame structure (not shown)). Additionally, another row of racks 322 may exhaust air into hot aisle 316.

In some embodiments, a fully expanded pre-assembled data center infrastructure module, such as data center infrastructure module 104, may provide power support to racks 318 and 320 via primary power buses 114 and 120 and secondary power buses 116 and 118. Also, a fully expanded pre-assembled data center infrastructure module, such as data center infrastructure module 104, may provide networking support to racks 318 and 320 via cable trays 310 supported by structural members 326 of collapsible frame 308.

In some embodiments, a pre-assembled data center infrastructure module, may be configured to couple with a single free-standing frame and provide data center infrastructure support for a single row of racks, for example for first or last rows in a computing room that are bounded by a wall on one side of the aisle. For example, in some embodiments, data center infrastructure module 324 may couple to frame structure 108 without coupling with an opposing frame structure on the other side of the data center infrastructure module. Also, data center infrastructure module 342 may provide data center infrastructure support for racks 322.

Figure 4A:
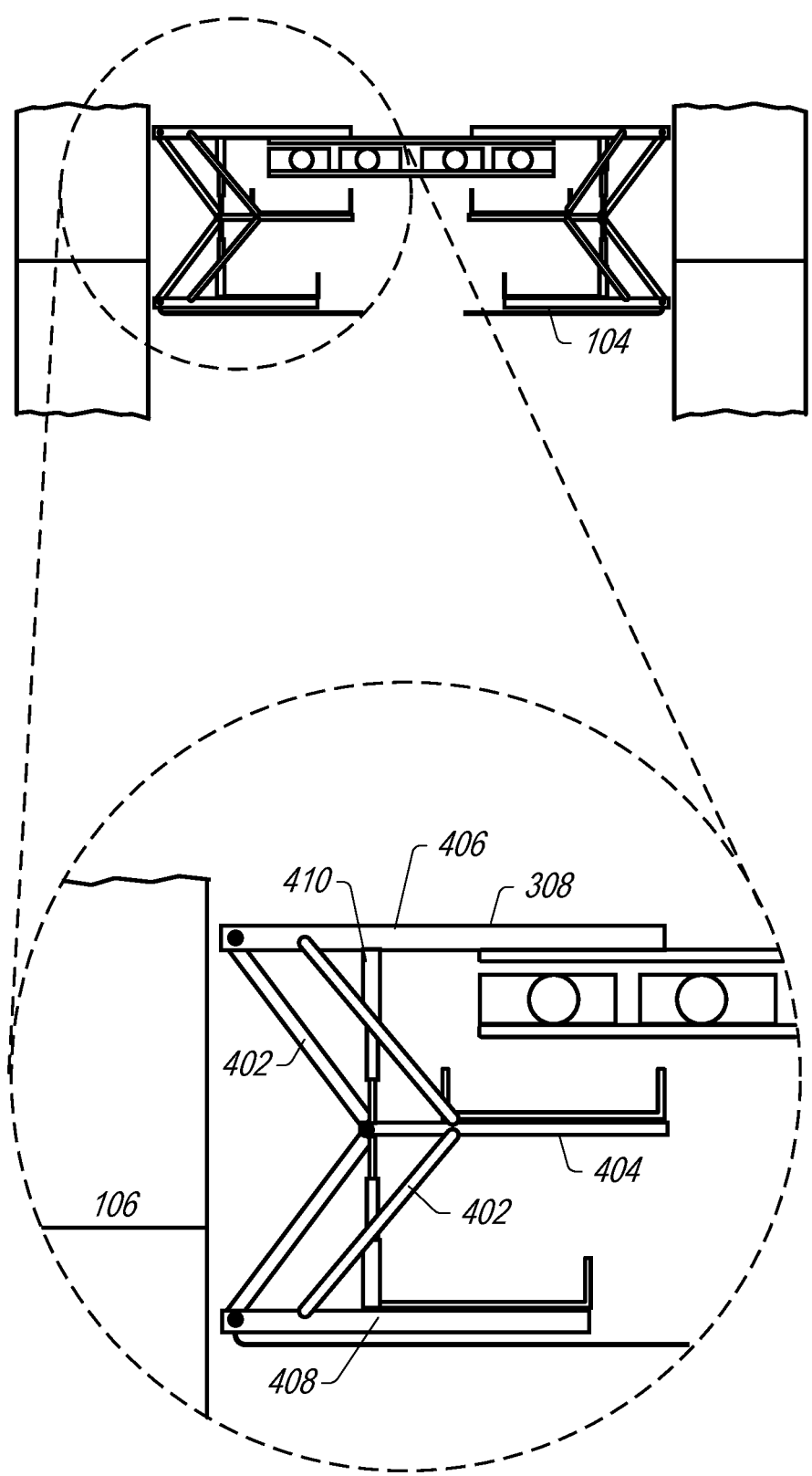
FIG. 4A illustrates a front view of a collapsible and expandable data center infrastructure module and a detailed view of a collapsible frame of the collapsible and expandable data center infrastructure module, according to some embodiments.

FIG. 4A illustrates a front view of a collapsible and expandable data center infrastructure module and a detailed view of a collapsible frame of the collapsible and expandable data center infrastructure module, according to some embodiments. In some embodiments, a collapsible frame as described in FIGS. 1-3, such as collapsible frame 308, may be configured as described in regard to FIG. 4A.

Figure 4B:
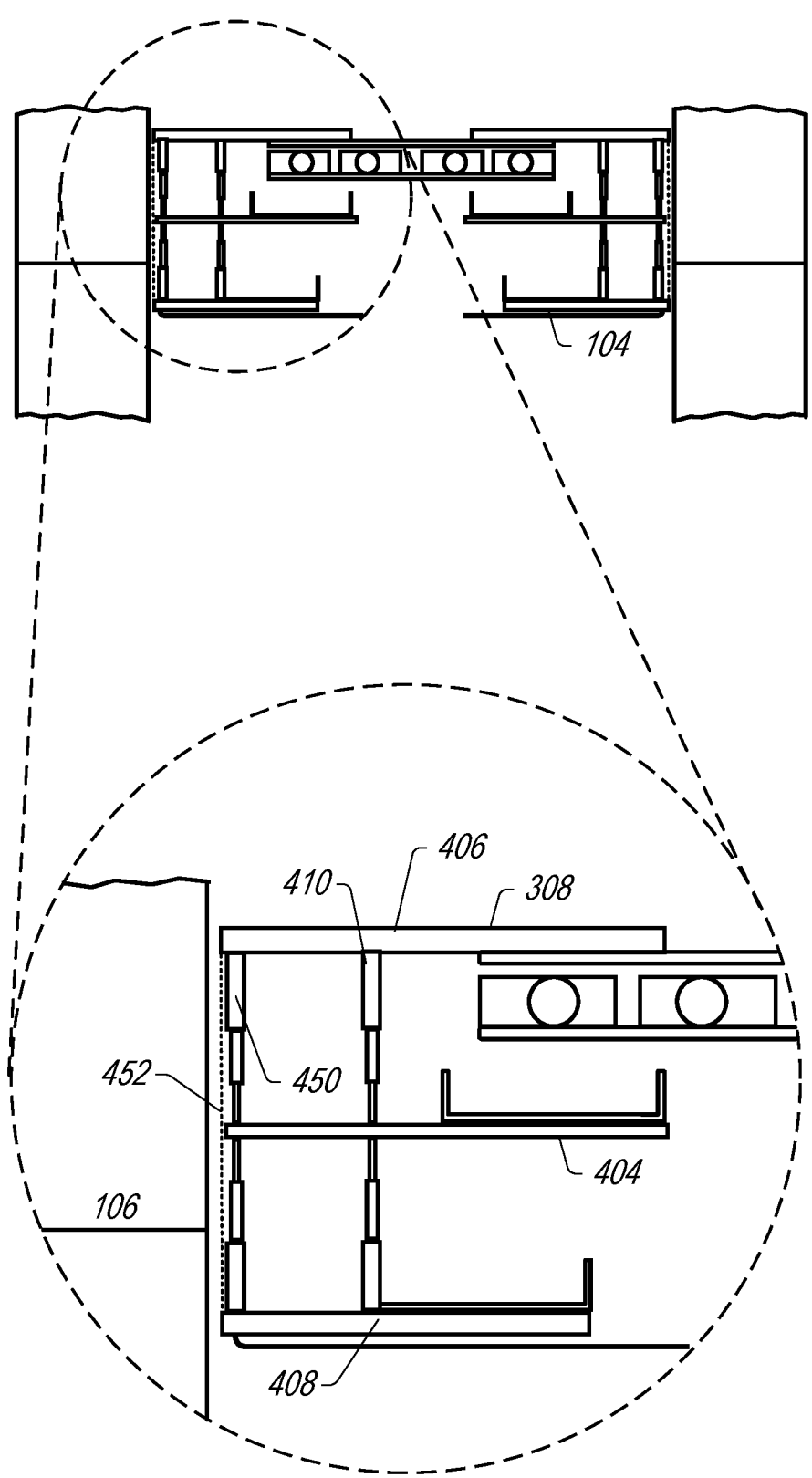
FIG. 4B illustrates a front view of a collapsible and expandable data center infrastructure module and a detailed view of a collapsible frame of the collapsible and expandable data center infrastructure module, according to some embodiments.

In some embodiments, a collapsible frame 308 of a data center infrastructure module 104 may include multiple folding structural members 402. The folding structural members 402 may be connected to a mid-level horizontal structural member 404. One set of the folding structural members 402 may be connected on an opposite end to upper horizontal structural member 406. Another set of the folding structural members 402 may be connected on an opposite end to lower horizontal structural member 408. In some embodiments, the folding structural members may be connected via hinged or pinned connections that enable the folding structural members 402 to rotate relative to the horizontal structural members. In some embodiments, the folding structural members 402 may be spaced along the horizontal structural members such that the folding structural members provide torsional support to the horizontal structural members in a fully expanded state to prevent rotation of the horizontal structural members about an axis running through the page as illustrated in FIG. 4.

In some embodiments, a collapsible frame 308 of a data center infrastructure module 104, may further include a mechanical linkage and/or spring mechanism such as a piston device/telescoping device 410. The spring mechanism may assist in expanding the data center infrastructure module 104 and may further provide support to horizontal structural members when in an expanded state. In some embodiments, a collapsible frame of a pre-assembled data center infrastructure module, such as collapsible frame 308, may include a mechanical linkage that secures the collapsible frame in a collapsed state such that the collapsed frame is secured at a fixed collapsed height. For example, this may prevent the collapsible frame from further collapsing beyond the collapsed height during transit. As a result, this may protect infrastructure systems within the collapsed data center infrastructure module from damage during shipping. The mechanical linkage may also secure the collapsible frame in an expanded state such that the collapsible and expandable frame is secured at a fixed expanded height. For example, in some embodiments, piston device/telescoping device 410 may represent a mechanical linkage. In some embodiments, a mechanical linkage and a spring mechanism may be combined. For example, a piston device/telescoping device 410 may include pins and corresponding pin holes that allow the piston device/telescoping device to be secured at a collapsed height and to also be secured at an expanded height. In some embodiments, other types of mechanical linkages may be used other than a piston device or a telescoping device.

4B illustrates a front view of a collapsible and expandable data center infrastructure module and a detailed view of a collapsible frame of the collapsible and expandable data center infrastructure module, according to some embodiments. In some embodiments, a collapsible frame as described in FIGS. 1-3, such as collapsible frame 308, may be configured as described in regard to FIG. 4B.

In some embodiments, a pre-assembled data center infrastructure module may include multiple mechanical linkages (in addition to or in place of folding structural members, such as folding structural members 402). For example, collapsible frame 308 illustrated in FIG. 4B includes piston/telescoping device 410 and an additional piston/telescoping device 450. In a similar manner as described above in regard to folding structural members 402, mechanical linkages, such as piston/telescoping devices 410 and 450 may be spaced to prevent torsional rotation of horizontal structural members 404, 406, and 408.

In some embodiments, a pre-assembled data center infrastructure module may include flexible side-panels. The flexible side-panels may protect the data center infrastructure components of the pre-assembled data center infrastructure module from damage during shipping and may function as an air containment barrier, for example between a hot aisle and cold aisle, when the pre-assembled data center infrastructure module is expanded and deployed. For example, in some embodiments, data center infrastructure module 104 includes flexible panel 452. In some embodiments, flexible panel 452, may be made of a plastic material, fabric material, or other flexible material.

Figure 5A:
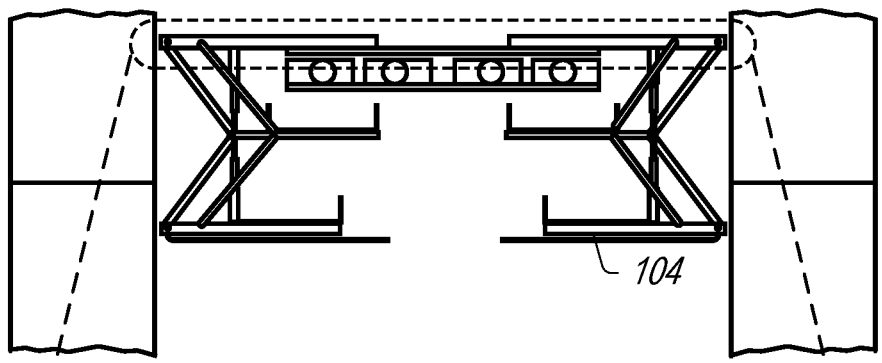
FIG. 5A illustrates a front view of a collapsible and expandable data center infrastructure module, according to some embodiments.
Figure 5B:
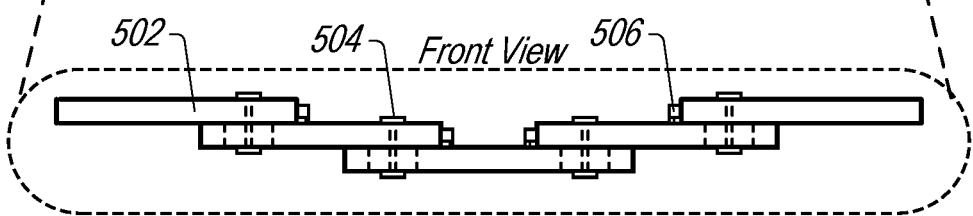
FIG. 5B illustrates a detailed front view of collapsible air containment panels of a collapsible and expandable data center infrastructure module, according to some embodiments.
Figure 5C:
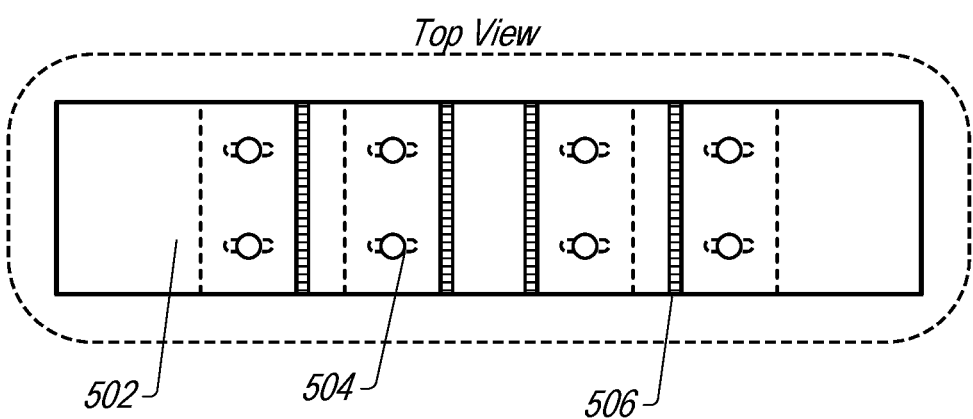
FIG. 5C illustrates a detailed top view of collapsible air containment panels of a collapsible and expandable data center infrastructure module, according to some embodiments.

FIG. 5A illustrates a front view of a collapsible and expandable data center infrastructure module, according to some embodiments. FIG. 5B illustrates a detailed front view of collapsible air containment panels of a collapsible and expandable data center infrastructure module, according to some embodiments. FIG. 5C illustrates a detailed top view of collapsible air containment panels of a collapsible and expandable data center infrastructure module, according to some embodiments.

Any of the pre-assembled data center infrastructure modules described herein may include collapsible air containment panels as described below in regard to FIGS. 5A-5C.

In some embodiments, in order to allow a pre-assembled data center infrastructure module to collapse horizontally, horizontal structural elements may translate relative to one another. For example structural panels and/or air containment panels may slide one above another to allow the pre-assembled data center infrastructure module to collapse horizontally and may slide relatively to one another in an opposite direction to allow the pre-assembled data center infrastructure module to expand horizontally.

For example, FIG. 5B illustrates a front view of horizontal air containment panels of data center infrastructure module 104. In some embodiments, air containment panels 504 may be stacked upon one another and coupled together with bolts or other types of fasteners (such as bolt 504) that pass through a slot in a portion of a lower layered air containment panel. Because the slot is covered by the higher level air containment panel, air cannot leak out through the slot in a significant manner. Also, brushes, cushions, or other types of malleable sealing materials (such as seal 506) are positioned at an edge of an upper layer air containment panel. The sealing material allows an upper and lower layer air containment panel to slide or translate relative to one another but also maintains a seal between the upper layer and lower layer air containment panel.

Figure 6A:
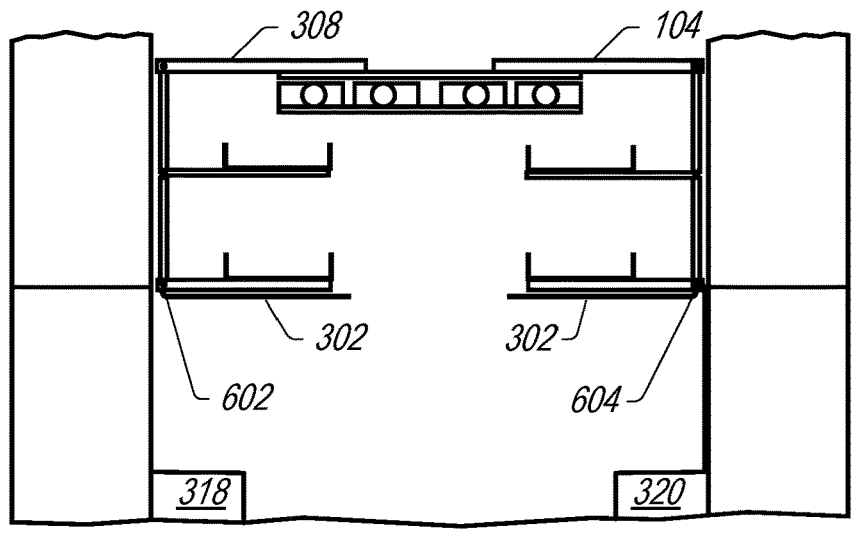
FIGS. 6A-6C illustrate a front view of a data center aisle between frame structures for data center rows, wherein air containment panels of a collapsible and expandable data center infrastructure module positioned between the frame structures are being deployed, according to some embodiments.
Figure 6B:
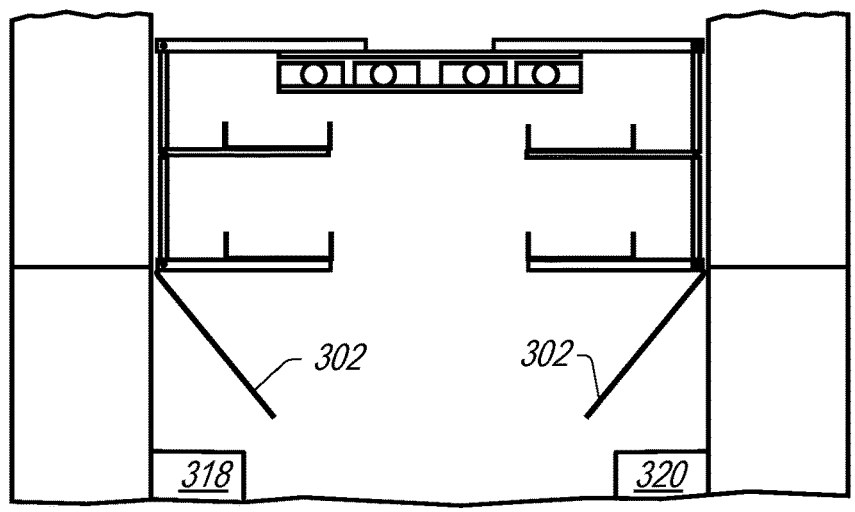
Figure 6C:
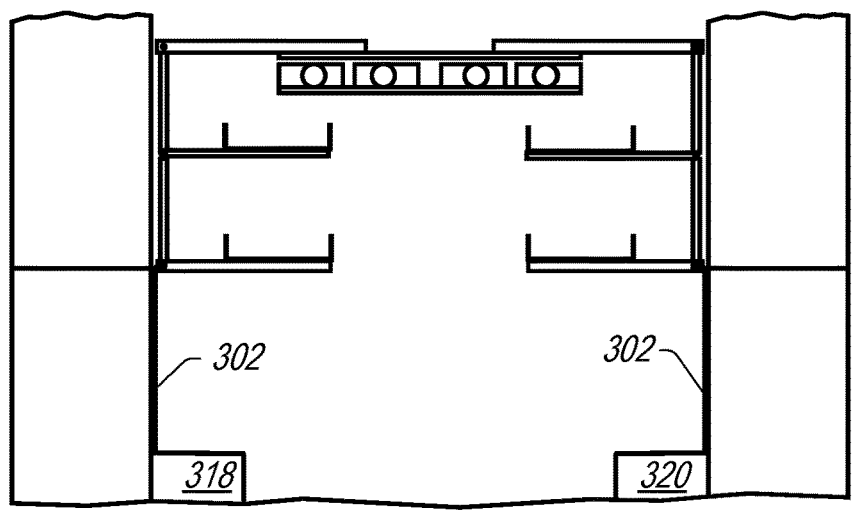

FIGS. 6A-6C illustrate a front view of a data center aisle between frame structures for data center rows, wherein air containment panels of a collapsible and expandable data center infrastructure module positioned between the frame structures are being deployed, according to some embodiments.

In some embodiments, shipping protection panels/air containment panels of a pre-assembled data center infrastructure module, such as shipping protection panels/air containment panels 302, may be connected to a collapsible frame 308 via hinged connections 602 and 604. The hinged connections may enable the shipping protection panels/air containment panels 302 to be unfolded as shown in FIGS. 6A-6C such that the shipping protection panels/air containment panels 302 form an air containment barrier in a space between the tops of racks 318 and 320 and data center infrastructure module 104.

In some embodiments, a data center infrastructure module, such as shown in FIGS. 6A-6C may include flexible shipping protection panels/air containment panels 302. In such embodiments, the shipping protection panels/air containment panels 302 may unfold or telescope out, wherein the flexible shipping protection panels/air containment panels 302 are folded back upon themselves via multiple folds.

Figure 7A:
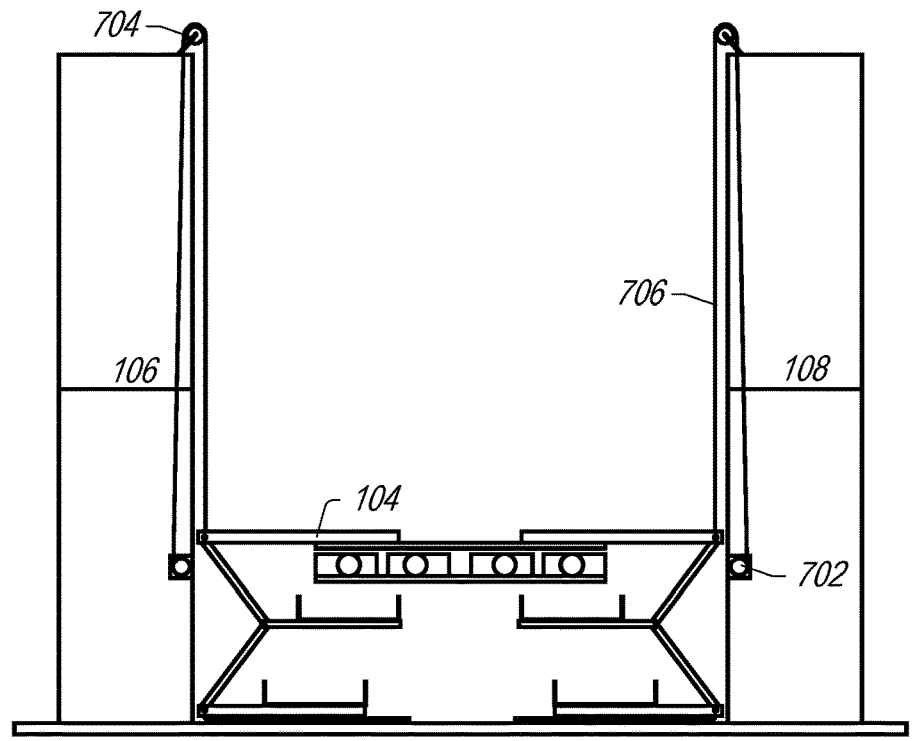
FIG. 7A illustrates a front view of a data center aisle between frame structures for data center rows, wherein a collapsible and expandable data center infrastructure module positioned between the frame structures is positioned on a floor between the frame structures, according to some embodiments.

FIG. 7A illustrates a front view of a data center aisle between frame structures for data center rows, wherein a collapsible and expandable data center infrastructure module positioned between the frame structures is positioned on a floor between the frame structures, according to some embodiments.

In some embodiments, a self-standing frame structure, such as self-standing frame structures 106 and 108 may include a pulley and hoist system or other system to elevate a pre-assembled data center infrastructure module.

Initially, a pre-assembled data center infrastructure module, such as data center infrastructure module 104, may be positioned on a floor between self-standing frames 106 and

108. The self-standing frames 106 and 108 may include a pulley and hoist system that includes hoists 702, pulleys 704, and cables 706. The cables may be connected to rigging connection points of data center infrastructure module 104.

Figure 7B:
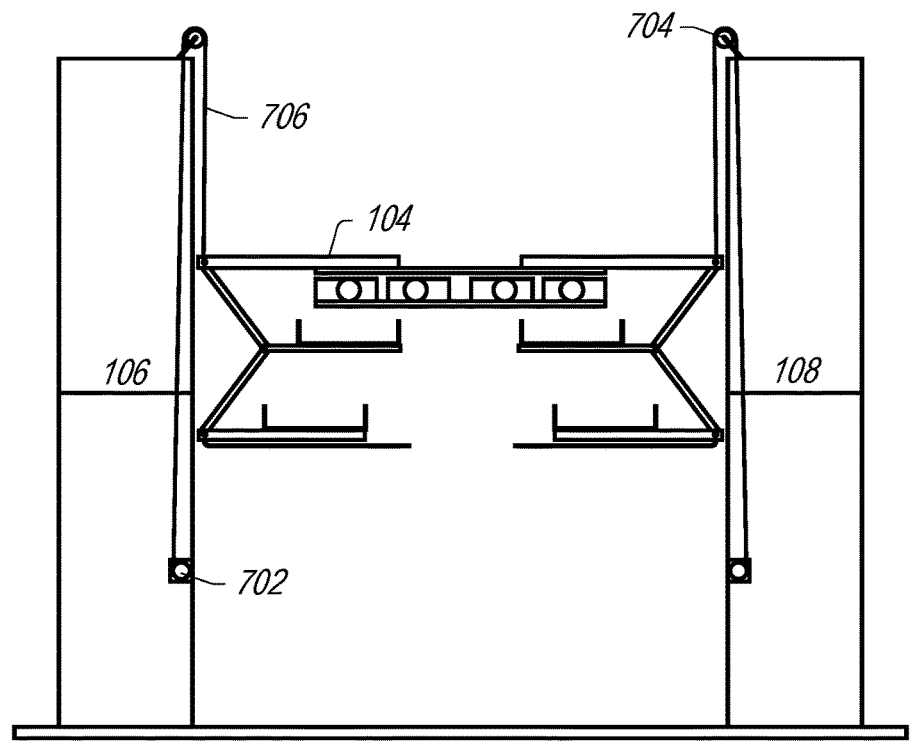
FIG. 7B illustrates a front view of a data center aisle between frame structures for data center rows, wherein a collapsible and expandable data center infrastructure module positioned between the frame structures is elevated at a working height above a floor between the frame structures, according to some embodiments.

FIG. 7B illustrates a front view of a data center aisle between frame structures for data center rows, wherein a collapsible and expandable data center infrastructure module positioned between the frame structures is elevated at a working height above a floor between the frame structures, according to some embodiments.

In some embodiments, a pulley and hoist system, such as pulleys 704, hoists 702, and cables 706 may be used to elevated a pre-assembled data center infrastructure module, such as data center infrastructure module 104, to a working height as shown in FIG. 7B. At the working height, various connections to other data center system and data center clients of the pre-assembled data center infrastructure module, such as server racks, may be completed. Also, at the working height, the pre-assembled data center infrastructure module may be expanded vertically.

Figure 7C:
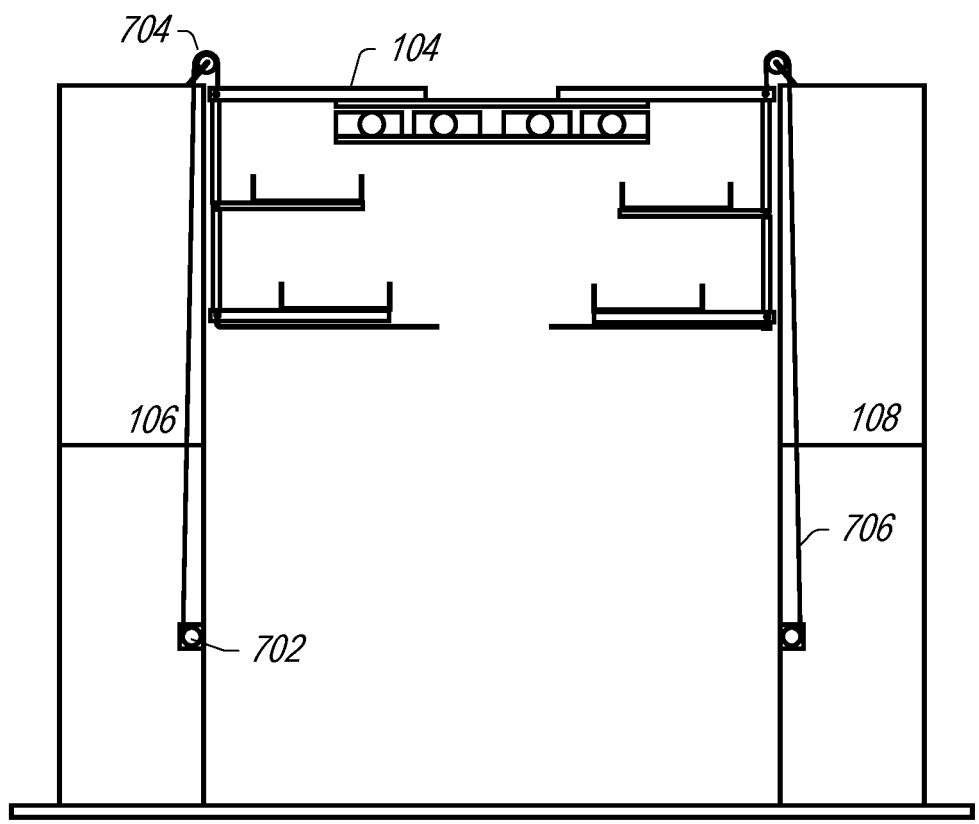
FIG. 7C illustrates a front view of a data center aisle between frame structures for data center rows, wherein a collapsible and expandable data center infrastructure module positioned between the frame structures has been elevated to a final height, according to some embodiments.

FIG. 7C illustrates a front view of a data center aisle between frame structures for data center rows, wherein a collapsible and expandable data center infrastructure module positioned between the frame structures has been elevated to a final height, according to some embodiments.

As shown in FIG. 7C, a pulley and hoist system, such as pulleys 704, hoists 702, and cables 706 may be used to elevated a pre-assembled data center infrastructure module, such as data center infrastructure module 104, to a final height as shown in FIG. 7C.

Figure 7D:
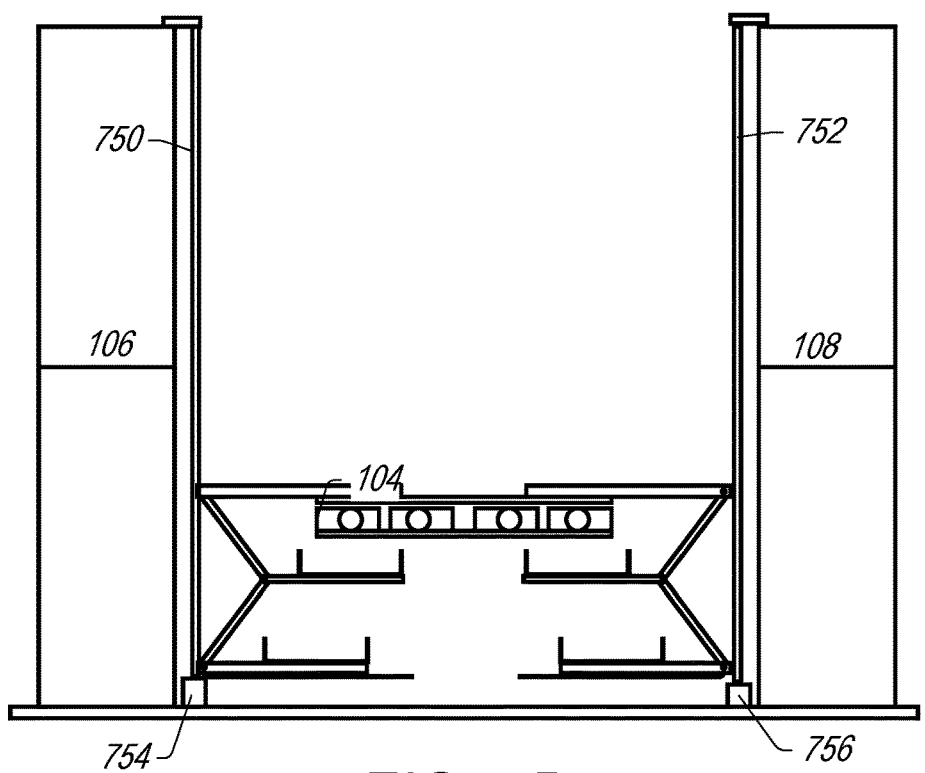
FIG. 7D illustrates a front view of a data center aisle between frame structures for data center rows, wherein a collapsible and expandable data center infrastructure module positioned between the frame structures is positioned on a floor between the frame structures, according to some embodiments.

FIG. 7D illustrates a front view of a data center aisle between frame structures for data center rows, wherein a collapsible and expandable data center infrastructure module positioned between the frame structures is positioned on a floor between the frame structures, according to some embodiments.

In some embodiments, a self-standing frame structure, such as self-standing frame structures 106 and 108 may include a ball-screw lift system, screw-lift, or other system to elevate a pre-assembled data center infrastructure module.

Initially, a pre-assembled data center infrastructure module, such as data center infrastructure module 104, may be positioned on a floor between self-standing frames 106 and 108. The self-standing frames 106 and 108 may be coupled with vertical screws 750 and 752. The vertical screws 752 and 754 may interface with a ball-screw gearbox or nut attached to the collapsible frame of the data center infrastructure module 104, such as ball-screw gearbox/nuts 754 and 756. The vertical screws 750 and 752 may rotate to cause the ball-screw gearbox or nuts 754 and 756 to be threaded up or down the vertical screws, thus causing the data center infrastructure module 104 to be raised or lowered. Alternatively, the ball-screw gearbox or nuts 754 and 756 may include a component that rotates about fixed vertical screws, such as vertical screws 750 and 752 to cause the data center infrastructure module 104 to be raised or lowered.

Figure 7E:
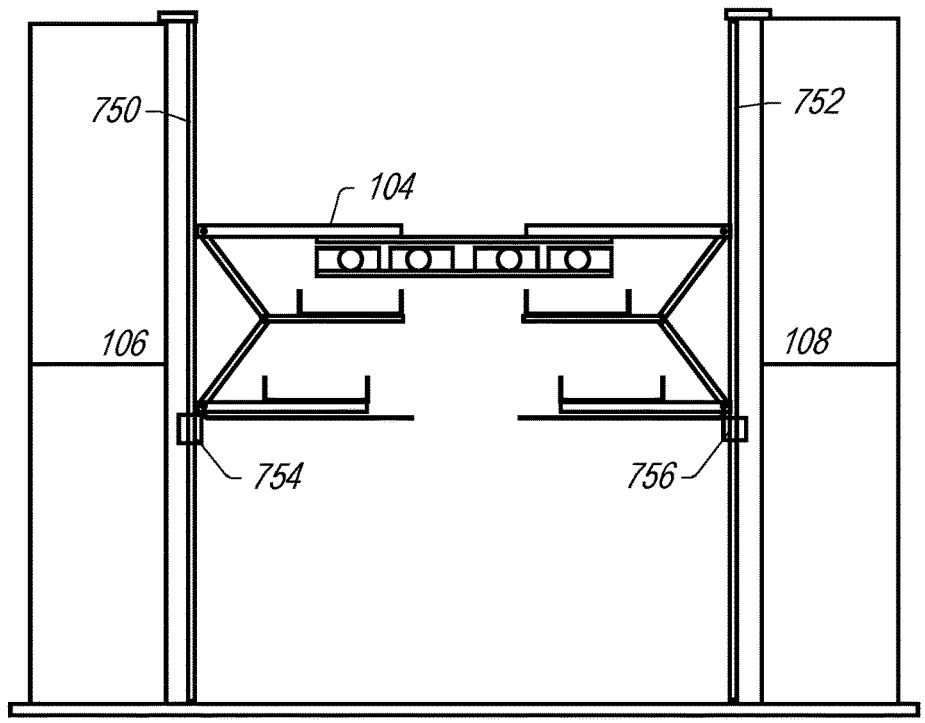
FIG. 7E illustrates a front view of a data center aisle between frame structures for data center rows, wherein a collapsible and expandable data center infrastructure module positioned between the frame structures is elevated at a working height above a floor between the frame structures, according to some embodiments.

FIG. 7E illustrates a front view of a data center aisle between frame structures for data center rows, wherein a collapsible and expandable data center infrastructure module positioned between the frame structures is elevated at a working height above a floor between the frame structures, according to some embodiments.

In some embodiments, a ball-screw lift system, such as vertical screws 750 and 752 and ball-screw gearbox or nuts 754 and 756, may be used to elevated a pre-assembled data center infrastructure module, such as data center infrastructure module 104, to a working height as shown in FIG. 7E. At the working height, various connections to other data center system and data center clients of the pre-assembled data center infrastructure module, such as server racks, may be completed. Also, at the working height, the pre-assembled data center infrastructure module may be expanded vertically.

Figure 7F:
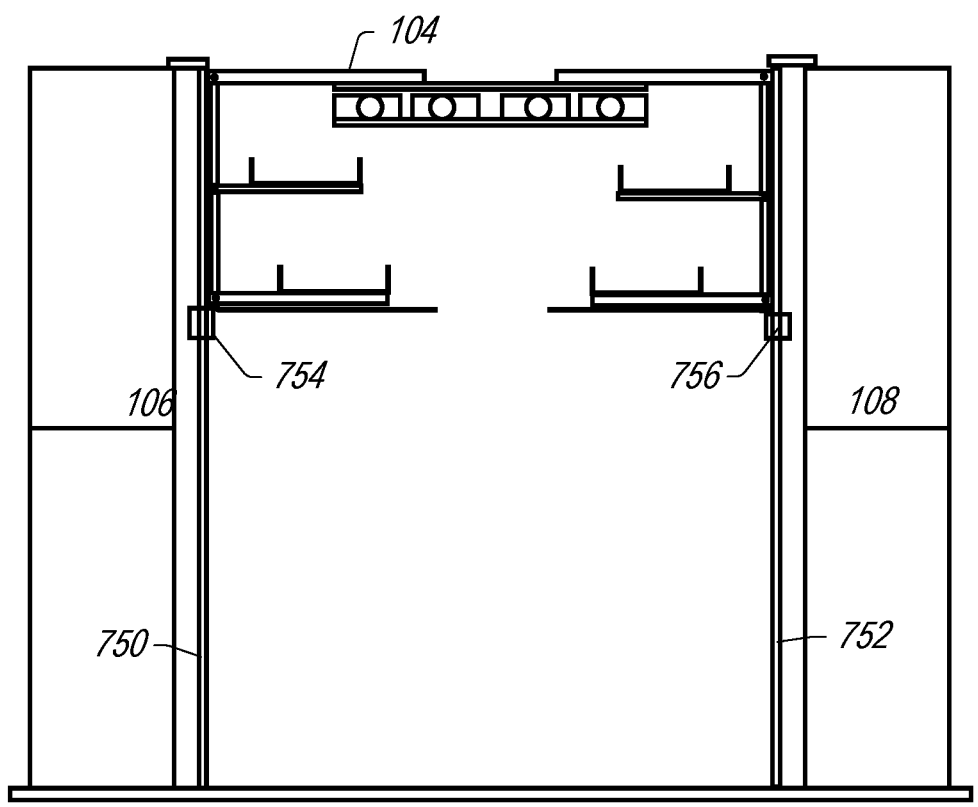
FIG. 7F illustrates a front view of a data center aisle between frame structures for data center rows, wherein a collapsible and expandable data center infrastructure module positioned between the frame structures has been elevated to a final height, according to some embodiments.

FIG. 7F illustrates a front view of a data center aisle between frame structures for data center rows, wherein a collapsible and expandable data center infrastructure module positioned between the frame structures has been elevated to a final height, according to some embodiments.

As shown in FIG. 7F, a ball-screw lift system, such as vertical screws 750 and 752 and ball-screw gearbox or nuts 754 and 756, may be used to elevated a pre-assembled data center infrastructure module, such as data center infrastructure module 104, to a final height as shown in FIG. 7F.

Figure 8A:
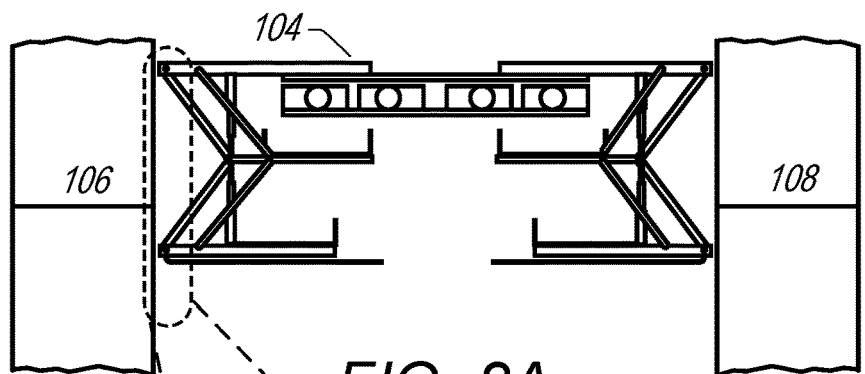
FIG. 8A illustrates a front view of a collapsible and expandable data center infrastructure module and frame structures for data center rows, according to some embodiments.
Figure 8B:
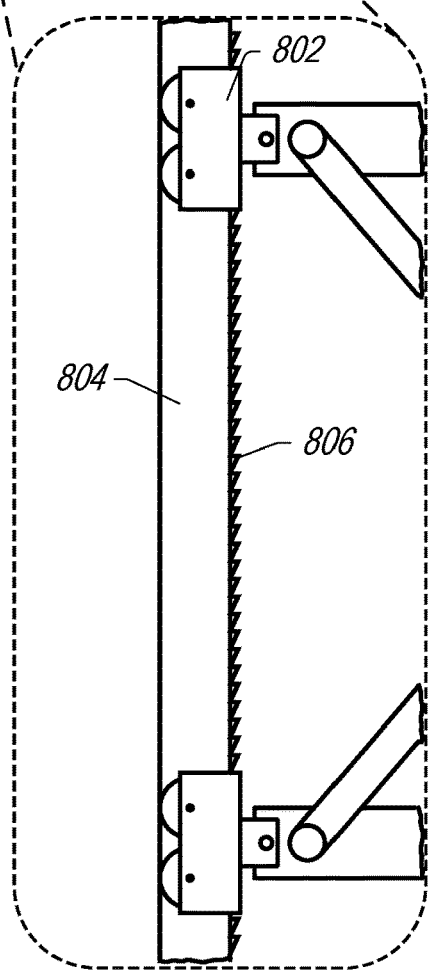
FIG. 8B illustrates a detailed cut-away view of a frame structure that includes guides and safety devices.

FIG. 8A illustrates a front view of a collapsible and expandable data center infrastructure module and frame structures for data center rows, according to some embodiments. FIG. 8B illustrates a detailed cut-away view of a frame structure that includes guides and safety devices. FIG. 8B also illustrates trolleys of a collapsible and expandable data center infrastructure module engaged with the guides of the frame structure, according to some embodiments. The data center infrastructure module 104 and self-standing frames 106 and 108 illustrated in FIGS. 8A and 8B may be any of the data center infrastructure modules and self-standing frames described herein, in some embodiments In some embodiments, a self-standing frame structure, such as self-standing frame structure 106 or 108, may include guides for trolleys of a pre-assembled data center infrastructure module, such as data center infrastructure module 104. For example, in some embodiments, self-standing frame structures 106 or 108 may be made of structural elements that are "C" shaped or square shaped with an opening on a side of the square that allows a trolley connector to travel up and down along the structural element. For example trolley 802 may travel inside a portion of structural member 804.

Additionally, in some embodiments, structural members of a self-standing frame, such as structural member 804 of self-standing frame 106, may include a safety device that allows a pre-assembled data center infrastructure module to be elevated, but prevents the pre-assembled data center infrastructure module from unintentionally falling. For example, structural member 804 includes ratcheting 806. In some embodiments, trolley 802 includes a pawl that engages with ratcheting 806 to allow data center infrastructure module 104 to be elevated but that prevents data center infrastructure module 104 from being lowered or dropped. In some embodiments, trolley 802 may include a lowering mechanism that disengages the pawl such that data center infrastructure module 104 can be lowered. However, by default, the pawl may be engaged for safety reasons.

Figure 8C:
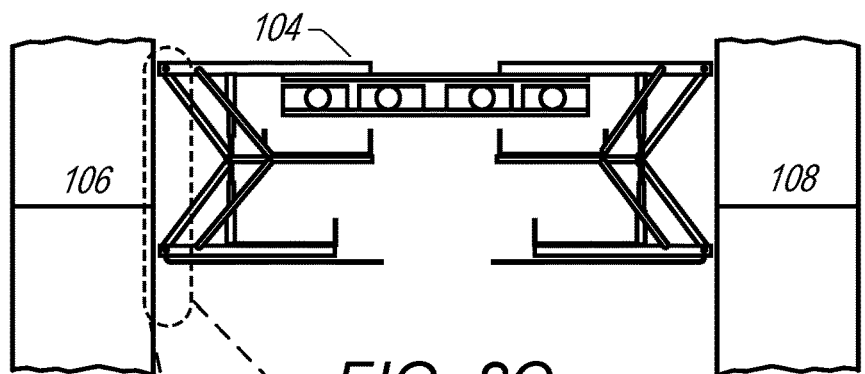
FIG. 8C illustrates a front view of a collapsible and expandable data center infrastructure module and frame structures for data center rows, according to some embodiments.
Figure 8D:
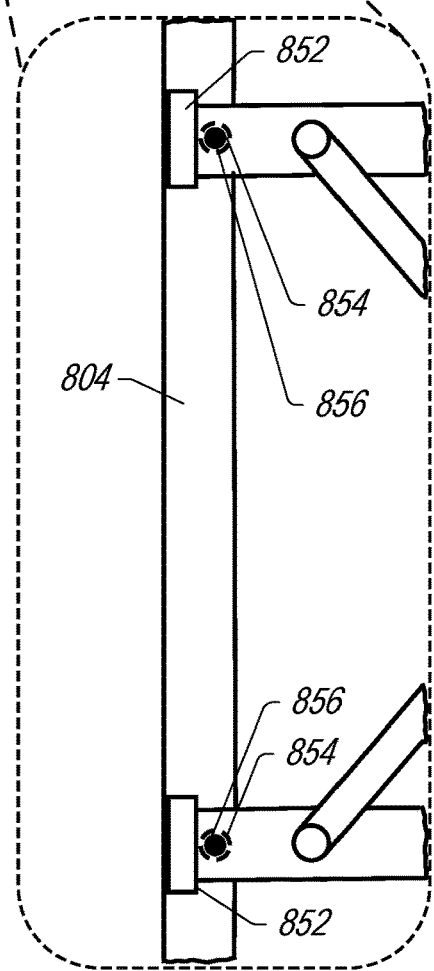
FIG. 8D illustrates a detailed cut-away view of a frame structure that includes guides and safety devices.

FIG. 8C illustrates a front view of a collapsible and expandable data center infrastructure module and frame structures for data center rows, according to some embodiments. FIG. 8D illustrates a detailed cut-away view of a frame structure that includes guides and safety devices. FIG. 8D also illustrates low-friction bumpers of a collapsible and expandable data center infrastructure module engaged with the guides of the frame structure, according to some embodiments. The data center infrastructure module 104 and self-standing frames 106 and 108 illustrated in FIGS. 8C and 8D may be any of the data center infrastructure modules and self-standing frames described herein, in some embodiments.

In some embodiments, a self-standing frame structure, such as self-standing frame structure 106 or 108, may include guides for low-friction bumpers attached to or part of a pre-assembled data center infrastructure module, such as data center infrastructure module 104. For example, in some embodiments, self-standing frame structures 106 or 108 may be made of structural elements that are "C" shaped or square shaped with an opening on a side of the square that allows a low-friction bumper to travel up and down along the structural element. For example low-friction bumpers 852 may travel inside a portion of structural member 804.

Additionally, in some embodiments, structural members of a self-standing frame, such as structural member 804 of self-standing frame 106, may include a safety device that allows a pre-assembled data center infrastructure module to be elevated, but prevents the pre-assembled data center infrastructure module from unintentionally falling. For example, structural member 804 includes holes 854 for clevis pins 856. In some embodiments, structural member 804 includes sets of holes 854 at a working height and another set of holes 856 at a final height.

Figure 9A:
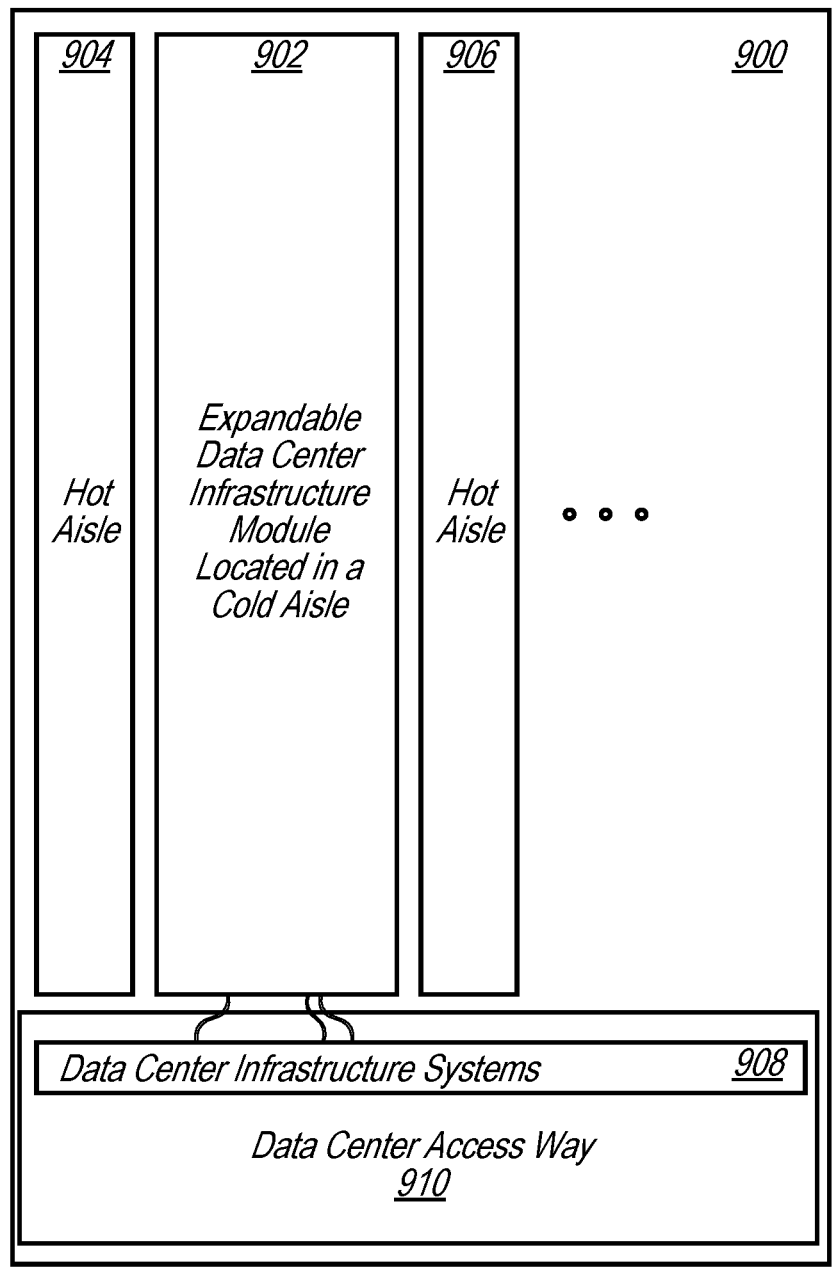
FIG. 9A illustrates a top view of a data center that includes a collapsible and expandable data center infrastructure module, according to some embodiments.

FIG. 9A illustrates a top view of a data center that includes a collapsible and expandable data center infrastructure module, according to some embodiments.

In some embodiments, a pre-assembled data center infrastructure module may extend a full length of a data center aisle/row. By extending a full length of an aisle/row the pre-assembled data center infrastructure module may be connected to data center infrastructure systems at a single end without the need for additional connections.

For example, data center 900 includes expandable data center infrastructure module 902 located in a cold aisle between hot aisles 904 and 906. The expandable data center infrastructure module 902 spans the full length of the cold aisle and hot aisles and connects to data center infrastructure systems 908 at a single end of the aisles. The data center infrastructure systems 908 run along a data center access way 910 that is perpendicular to the cold aisle and hot aisles 904 and 906.

Figure 9B:
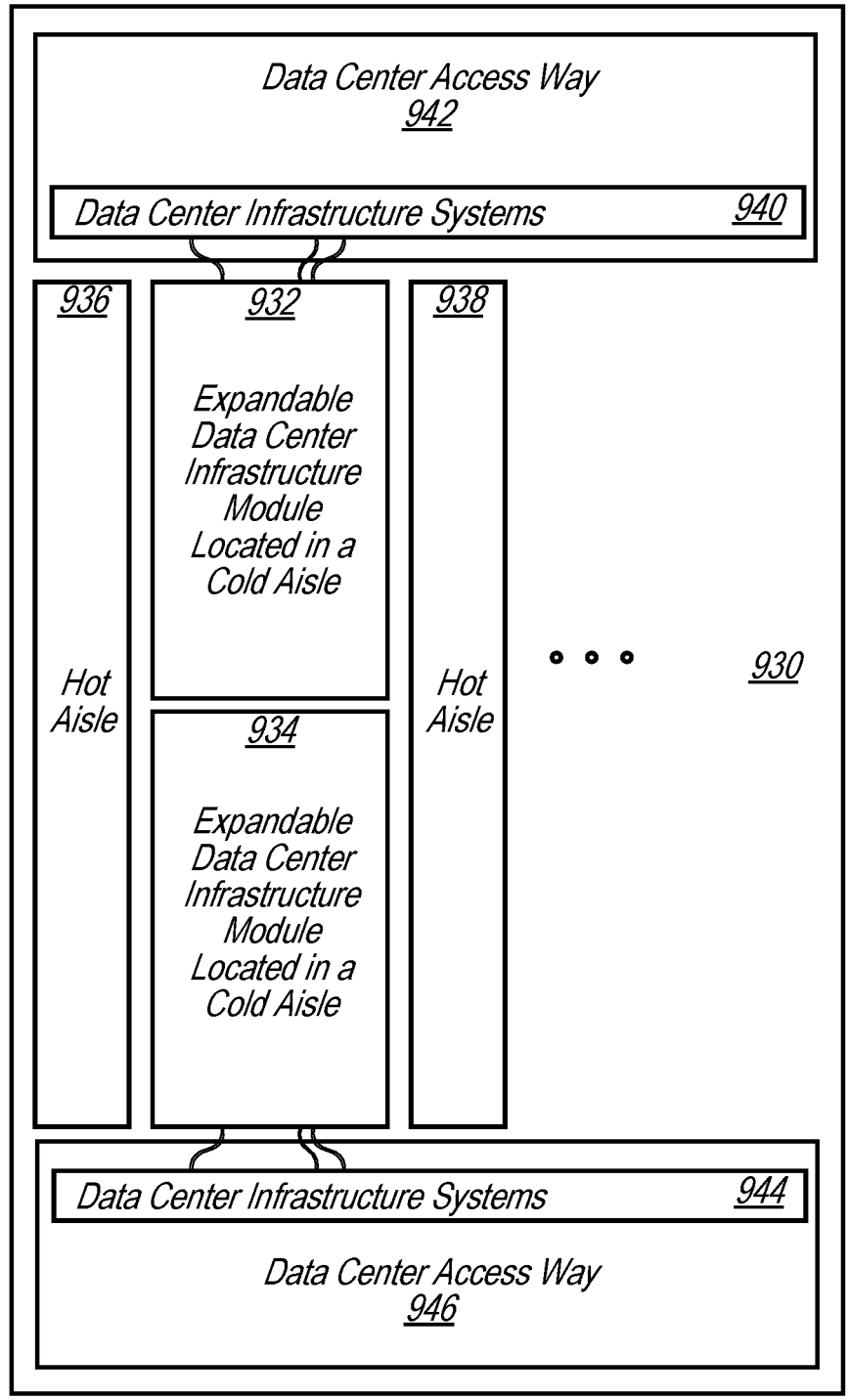
FIG. 9B illustrates a top view of a data center that includes collapsible and expandable data center infrastructure modules extending towards a mid-point of an aisle from opposing ends of the aisle, according to some embodiments.

FIG. 9B illustrates a top view of a data center that includes collapsible and expandable data center infrastructure modules extending towards a mid-point of an aisle from opposing ends of the aisle, according to some embodiments.

In some embodiments, a pre-assembled data center infrastructure module, such as expandable data center infrastructure modules 932 and 934, may extend an approximate half-length of an aisle towards a mid-point of the aisle. In this way the data center infrastructure modules may connect to data center infrastructure systems at either end of an aisle without requiring connections between the data center infrastructure modules.

For example, data center 930 includes expandable data center infrastructure module 932 that is connected to data center infrastructure systems 940 at a first end of hot aisles 936 and 938. The data center infrastructure systems 940 run along a first data center access way 942. Additionally, data center infrastructure module 934 is connected to data center infrastructure systems 944 at a second end of hot aisles 936 and 938. The data center infrastructure systems 944 run along a second data center access way 942.

Figure 9C:
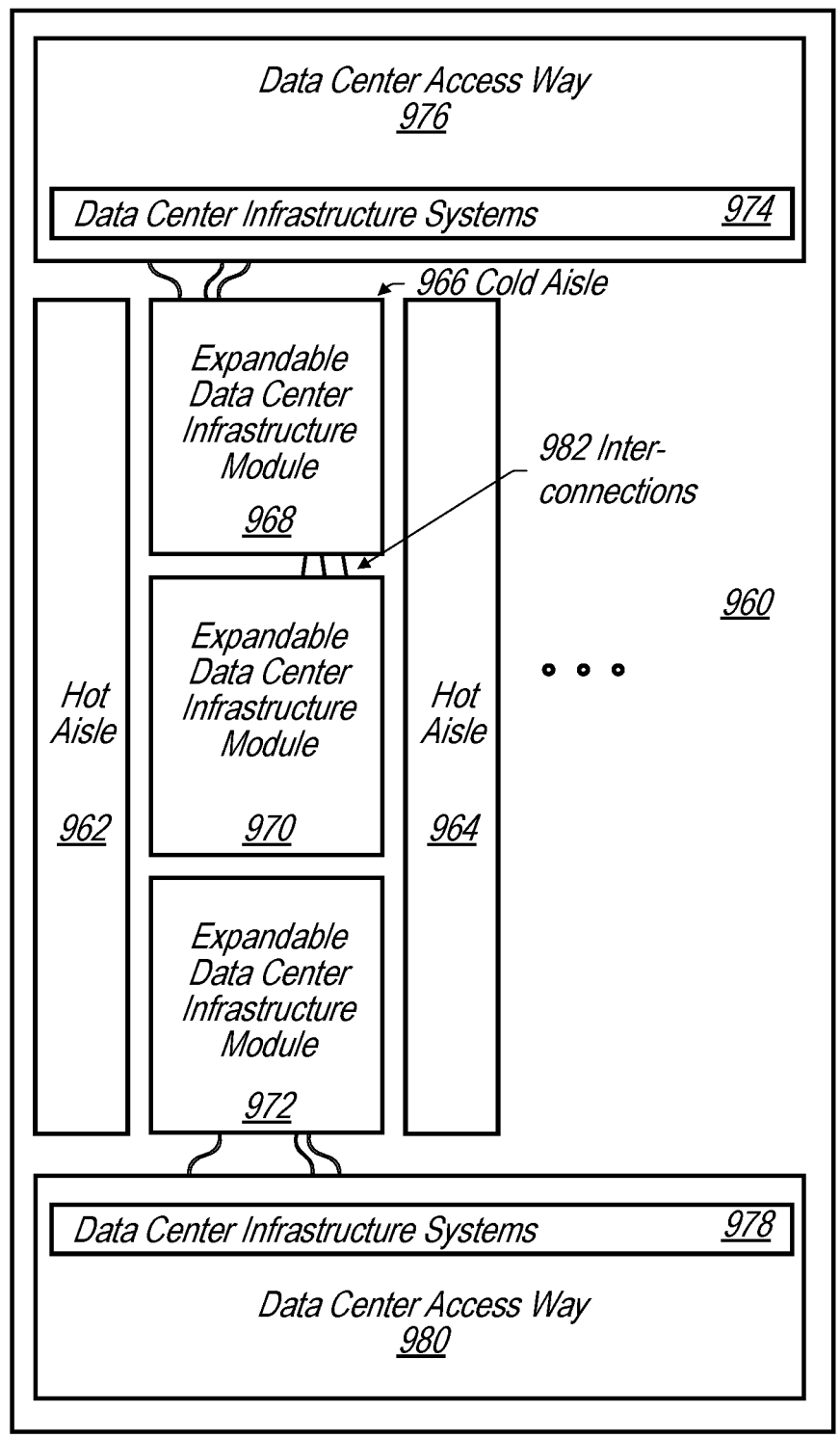
FIG. 9C illustrates a top view of a data center that includes more than two collapsible and expandable data center infrastructure modules mounted in an aisle of the data center, according to some embodiments.

FIG. 9C illustrates a top view of a data center that includes more than two collapsible and expandable data center infrastructure modules mounted in an aisle of the data center, according to some embodiments.

In some embodiments, more than two pre-assembled data center infrastructure modules may be positioned along an aisle/row and at least one of the data center infrastructure modules may be connected to another one of the data center infrastructure modules.

For example, data center 960 includes hot aisles 962 and 964 and cold aisle 966 between hot aisles 962 and 964. Three pre-assembled data center infrastructure modules are positioned in cold aisle 966 between hot aisles 962 and 964. For example, expandable data center infrastructure modules 968, 970, and 972 are positioned in in cold aisle 966 between hot aisles 962 and 964.

Expandable data center infrastructure module 968 is connected to data center infrastructure systems 974 that run along data center access way 974. Expandable data center infrastructure module 972 is connected to data center infrastructure systems 978 that run along data center access way 980. Also expandable data center infrastructure module 970 is connected to expandable data center infrastructure module 968 via inter-connections 982.

In some embodiments, the connections described in FIGS. 9A-9C may be quick connect connections and may connect multiple types of data center infrastructure, such as power and networking, BMS controls, fire suppression etc.

In some embodiments, any of the expandable data center modules illustrated in FIGS. 9A-9C may include redundant data center infrastructure connections. For example, an expandable data center module may be redundantly connected to data center infrastructure systems. For example, in FIG. 9A expandable data center infrastructure module 902 may have redundant power connections to power distribution systems in data center access way 910. Also, other data center infrastructure systems such as networking systems, building management systems (BMS), fire suppression systems, etc. may be redundantly connected. Also, in some embodiments, expandable data center infrastructure modules may be redundantly connected to one another. For example, in some embodiments, interconnections 982 illustrated in FIG. 9C may include redundant data center infrastructure connections between expandable data center infrastructure module 968 and 970. Also, in some embodiments, expandable data center infrastructure module 970 may be singularly connected or redundantly connected to expandable data center infrastructure module 972 (not shown).

Figure 10A:
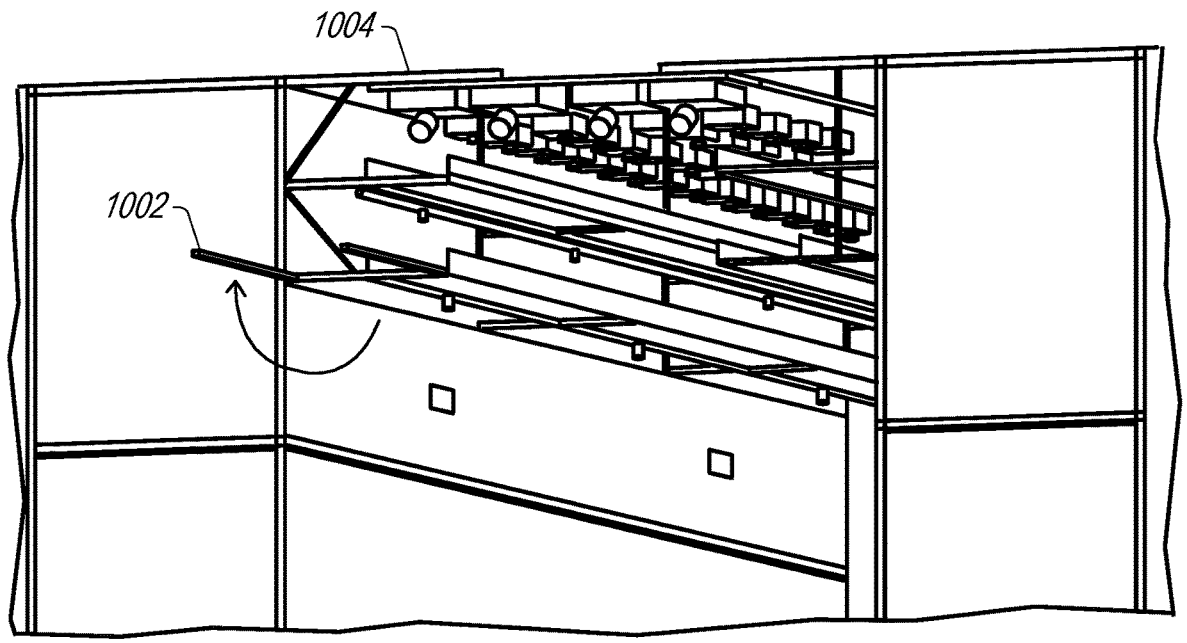
FIG. 10A illustrates a perspective view of an additional support structure of a collapsible and expandable data center infrastructure module, according to some embodiments.

FIG. 10A illustrates a perspective view of an additional support structure of a collapsible and expandable data center infrastructure module, according to some embodiments.

In some embodiments, a pre-assembled data center infrastructure module may include an additional support structure that is configured to articulate out from the pre-assembled data center infrastructure module, when installed, and provide support for infrastructure components in an access way adjacent to the installed pre-assembled data center infrastructure module.

For example, FIG. 10A illustrates data center infrastructure module 1004 that includes additional support 1002, wherein the additional support is configured to articulate into an access way perpendicular to an aisle over which data center infrastructure module 1004 is positioned.

Figure 10B:
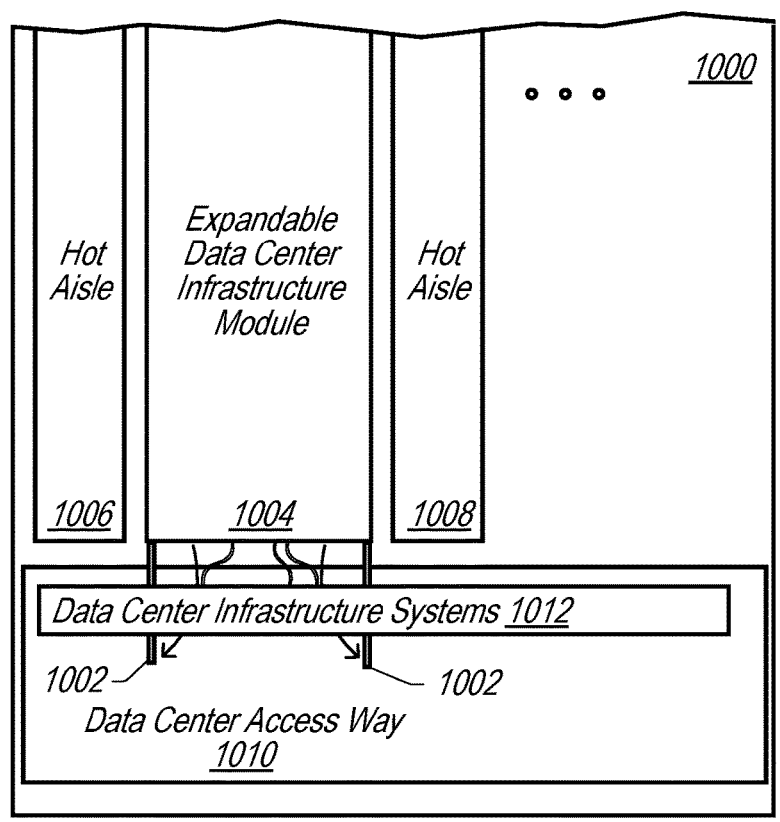
FIG. 10B illustrates a top view of an additional support structure of a collapsible and expandable data center infrastructure module, according to some embodiments.

FIG. 10B illustrates a top view of an additional support structure of a collapsible and expandable data center infrastructure module, according to some embodiments. The data center infrastructure module 1004 and the additional support 1002 illustrated in FIG. 10B may be a top view of the same components as illustrated in FIG. 10A.

For example data center 1000 includes hot aisles 1006 and 1008 and expandable data center infrastructure module 1004 mounted in a cold aisle between hot aisles 1006 and 1008. Expandable data center infrastructure module 1004 is connected to data center infrastructure systems 1012 that run along data center access way 1010. Note that data center access way 1010 runs perpendicular to hot aisles 1006 and 1008, and the cold aisle between hot aisles 1006 and 1008 in which expandable data center infrastructure module 1004 is mounted. In some embodiments, data center infrastructure systems 1012 are supported by additional supports 1002 of expandable data center infrastructure module 1004, wherein the additional supports 1002 have been articulated into data center access way 1010. Data center access way 1010 may be an additional aisle of data center 1000 that runs perpendicular to hot aisles 1006 and 1008 and the cold aisle between hot aisles 1006 and 1008.

Figure 11:
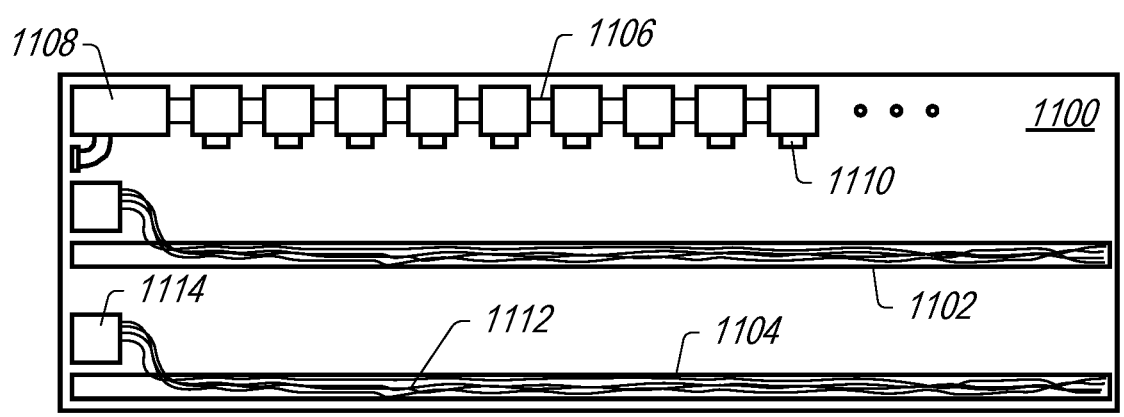
FIG. 11 illustrates a side view of a collapsible and expandable data center infrastructure module, according to some embodiments.

FIG. 11 illustrates a side view of a collapsible and expandable data center infrastructure module, according to some embodiments. Data center infrastructure module 1100 illustrated in FIG. 11 may be a data center infrastructure module 104 or any other data center infrastructure module described herein, in some embodiments.

Data center infrastructure module 1100 includes upper cable trays 1102 and lower cable trays 1104. Data center infrastructure module 1100 also includes power busways 1106. In some embodiments, a pre-assembled data center infrastructure module, such as data center infrastructure module 1100, includes multiple power busways 1106, such as a primary power busway and a reserve power busway and/or multiple primary power busways and multiple reserve power busways. For example, a pre-assembled data center infrastructure module, such as data center infrastructure module 1100, may include one set of primary and reserve power busways for a first row of racks supported by the data center infrastructure module 1100 and an additional set of primary and reserve power busways for a second row of racks supported by the data center infrastructure module 1100. In some embodiments, a reserve power busway may be supplied power from a common over-subscribed reserve power system that provides reserve power to other data center infrastructure modules.

In some embodiments, a power busway may be pre-installed in a pre-assembled data center infrastructure module, such as data center infrastructure module 1100. The power busway may include pre-installed connectors for connecting the power busway to a power distribution system of a data center and may also include pre-installed connectors for connecting loads (e.g. power busway clients), such as rack computing systems, to the power busway. For example, power busway 1106 includes pre-installed connector 1108 for connecting the power busway to an upstream power distribution system of a data center. The power busway 1106 also includes multiple pre-installed connectors 1110 for connecting respective loads to the power busway, such as rack-level power distribution units. In some embodiments, pre-installed connectors 1108 may be specifically designed to mate with matching connectors of a data center power distribution system and may be shaped or configured in a way that prevents an incorrect coupling of power connectors.

In some embodiments, a pre-assembled data center infrastructure module, such as data center infrastructure module 1100, may be transported to a data center location with cables already installed in cable trays of the pre-assembled data center infrastructure module. For example, data center infrastructure module 1100 may be shipped with cables 1112 already installed in upper cable trays 1102 and lower cable trays 1104. In some embodiments, cables 1112 may be terminated at interconnect plates 1114. In some embodiments, an interconnect plate, such as interconnect plate 1114, may bundle together multiple fiber connections and may be configured to mate with a corresponding interconnect plate of a data center network. For example, in some embodiments, interconnect plate 1114 may be a MTP style MPO connector (multiple-fiber push-on connector). In some embodiments, an interconnect plate may provide a quick connection. In some embodiments, the cables connected at respective first ends to the interconnect plate, may be labeled at respective second ends indicating to which device the cables are to be connected. In some embodiments, the cables may be loop checked prior to arriving at a data center location to ensure the cables are properly labeled.

Figure 12:
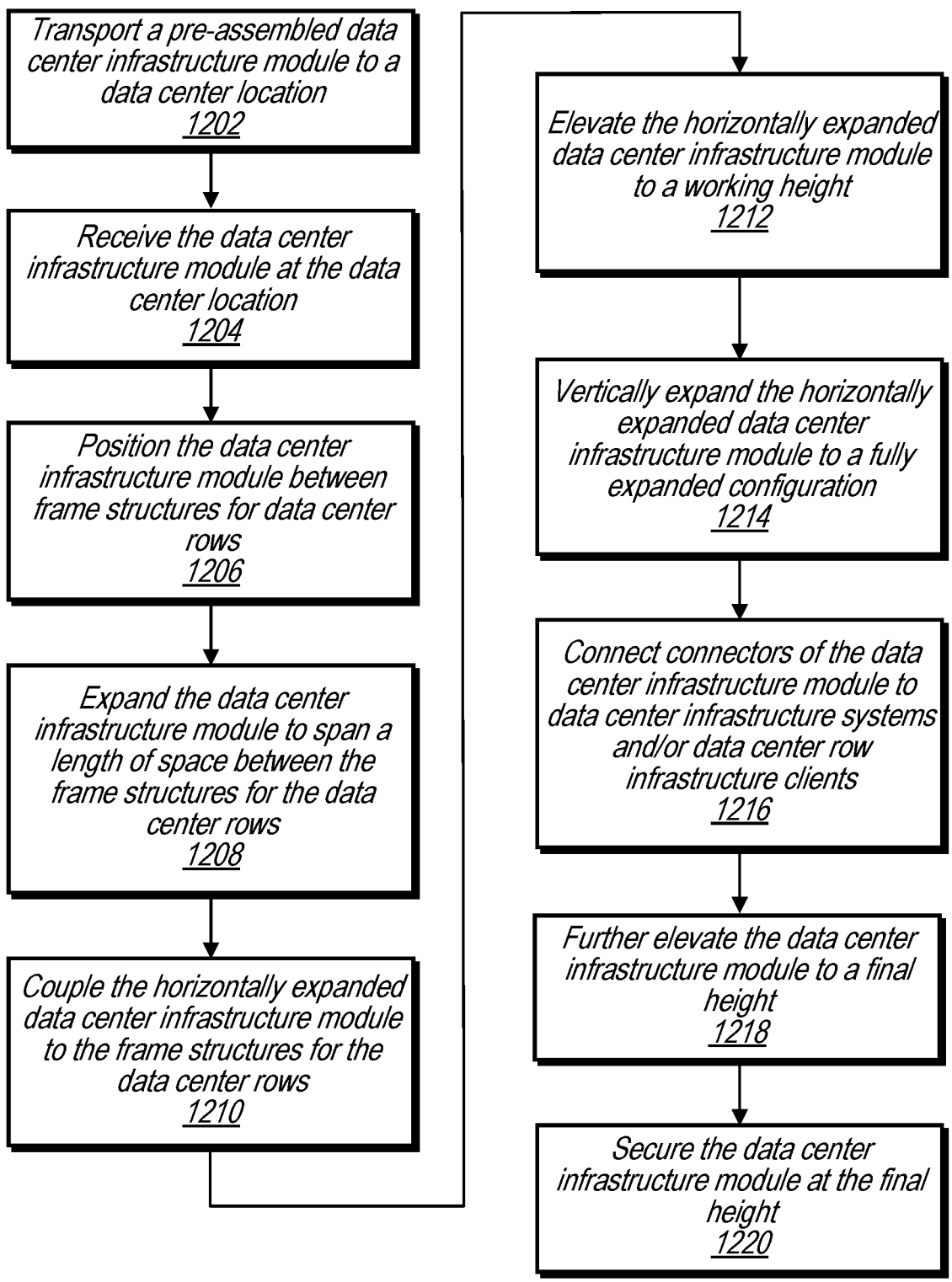
FIG. 12 is a flowchart illustrating a process for installing collapsible and expandable data center infrastructure modules in a data center, according to some embodiments.

FIG. 12 is a flowchart illustrating a process for installing collapsible and expandable data center infrastructure modules in a data center, according to some embodiments.

At 1202, a pre-assembled data center infrastructure module is transported to a data center location. In some embodiments, the pre-assembled data center infrastructure module may be shipped to the data center location in a standardized shipping container, such as a shipping container that conforms to ISO standards. Also, the pre-assembled data center infrastructure module may be shipped to the data center location in the shipping container along with additional pre-assembled data center infrastructure modules loaded in the shipping container.

At 1204, the data center infrastructure module is received at the data center location. The data center infrastructure module may be removed from a shipping container in which it was transported and may be rotated ninety degrees such that the pre-assembled data center infrastructure module is oriented in a same orientation as which it will be installed. The data center infrastructure module may be removed from the shipping container and rotated while still in a compact or collapsed state. In some embodiments, additional bracing may be attached to the pre-assembled data center infrastructure module to increase a torsional rigidity of the pre-assembled data center infrastructure module. Once the pre-assembled data center infrastructure module has been rotated to its installation orientation, the additional bracing may be removed.

At 1206, the pre-assembled data center infrastructure module is positioned between frame structures to which the data center infrastructure module is to be installed and secured at a final height.

At 1208, the pre-assembled data center infrastructure module is expanded horizontally such that the horizontally expanded data center infrastructure module spans a length of space between the frame structures. Expanding the pre-assembled data center infrastructure module horizontally may cause elements of a collapsible frame of the pre-assembled data center infrastructure module to translate relative to one another. For example, air containment panels on a top side of the pre-assembled data center infrastructure module may translate relative to one another as described in FIG. 5.

At 1210, the horizontally expanded pre-assembled data center infrastructure module may be coupled to the frame structures. For example, trolleys may be attached to the pre-assembled data center infrastructure module and to guideways of the frame structures as shown in FIG. 8.

At 1212, the horizontally expanded pre-assembled data center infrastructure module may be elevated to a working height. For example, a pulley and hoist system as shown in FIG. 7 may be used to elevate the pre-assembled data center infrastructure module to a working height.

At 1214, the horizontally expanded pre-assembled data center infrastructure module may additionally be vertically extended, such that the pre-assembled data center infrastructure module is in a fully expanded configuration. For example, FIG. 3E illustrates a pre-assembled data center infrastructure module that has been vertically expanded at a working height prior to being elevated to a final height.

At 1216, connectors of the pre-assembled data center infrastructure module may be connected to data center infrastructure systems such as an upstream power distribution system and data center network. Also, connectors of the pre-assembled data center infrastructure module may be connected to downstream clients of the data center infrastructure module such as racks of a rack row that is supported by the data center infrastructure module. For example, various connectors of a pre-assembled data center infrastructure module as illustrated in FIG. 11 may be connected to corresponding data center connectors.

At 1218, the pre-assembled data center infrastructure module may be further elevated to a final height. For example, FIG. 3F illustrates a pre-assembled data center infrastructure module at a final height.

At 1220, the pre-assembled data center infrastructure module may be secured at the final height. For example, pins or other types of fasteners may be inserted to secure the pre-assembled data center infrastructure module to self-standing frames.

Figure 13:
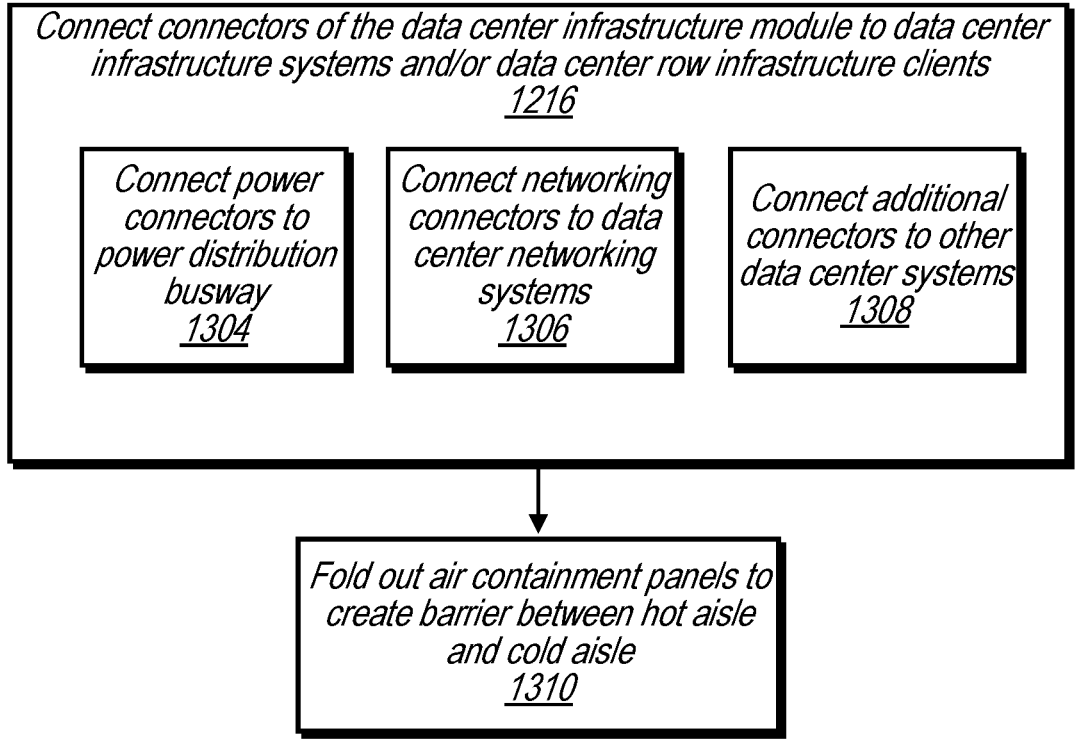
FIG. 13 is a flowchart illustrating additional steps that may be performed when installing a collapsible and expandable center row infrastructure module in a data center, according to some embodiments.

FIG. 13 is a flowchart illustrating additional steps that may be performed when installing a collapsible and expandable center row infrastructure module in a data center, according to some embodiments.

Step 1216 in FIG. 13 illustrates example connections that may be performed as part of step 1216 illustrated in FIG. 12.

In some embodiments, at 1304, a power distribution busway of the pre-assembled data center infrastructure module is connected to a power distribution system of a data center.

At 1306, networking connector plates of the pre-assembled data center infrastructure module are connected to corresponding networking connector plates of a data center.

At 1308, additional connectors, such as BMS sensor connectors, fire suppression system connectors, lighting connectors, air duct connectors, etc. are connected to corresponding connectors of a data center.

At 1310, air containment panels of the pre-assembled data center infrastructure module may be folded out to provide air containment between a cold aisle and one or more hot aisles. For example, air containment panels may be folded out as shown in FIG. 6.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of installing infrastructure at a data center, comprising:
   receiving, at a data center location, a pre-assembled data center infrastructure module, wherein the pre-assembled data center infrastructure module comprises a plurality of cable trays and a plurality of power busways coupled to a collapsible frame;
   positioning the pre-assembled data center infrastructure module between opposing frame structures for data center rows or aisles of the data center;
   expanding the pre-assembled data center infrastructure module; and
   securing the pre-assembled data center infrastructure module into a position between the opposing frame structures such that the cable trays and power busways of the pre-assembled data center infrastructure module provide support for the data center rows or aisles.

2. The method of claim 1, wherein expanding the pre-assembled data center infrastructure module comprises:
   expanding the pre-assembled data center infrastructure module horizontally to span a length of space between the opposing frame structures;
   coupling the pre-assembled data center infrastructure module that has been horizontally expanded to the opposing frame structures;
   elevating the pre-assembled data center infrastructure to an elevated position above a floor of the space between the opposing frame structures; and
   expanding the pre-assembled data center infrastructure module vertically.

3. The method of claim 1, further comprising:
   connecting pre-installed connectors of the pre-assembled data center infrastructure module to power and network connectors of the data center;
   connecting pre-installed connectors of the pre-assembled data center infrastructure module to a plurality of power connectors and a plurality of network connectors for a plurality of rack computer systems installed in, or to be installed in, the data center rows; and
   further elevating the pre-assembled data center infrastructure module to a final height above the floor of the space between the opposing frame structures.

4. The method of claim 1, wherein the pre-assembled data center infrastructure module comprises air containment panels coupled to the collapsible frame, the method further comprising:
   positioning respective ones of the air containment panels adjacent to the frame structures such that the air containment panels separate air in one or more respective hot aisles associated with the data center rows from air in one or more cold aisles associated with the data center rows.

5. The method of claim 1, further comprising:
   transporting the pre-assembled data center infrastructure module and an additional pre-assembled data center infrastructure module to the data center location in a standardized shipping container.

6. A data center infrastructure module, comprising:
   a collapsible frame;
   a first set of data center infrastructure components coupled to the collapsible frame; and
   a second set of data center infrastructure components coupled to the collapsible frame,
   wherein the data center infrastructure module is configured to:
      be transported to a data center location as a pre-assembled unit in a collapsed state; and
      be expanded at the data center location into an expanded data center infrastructure module, such that the expanded data center infrastructure module provides a plurality of types of data center infrastructure to a data center row or aisle at the data center location.

7. The data center infrastructure module of claim 6, wherein the collapsible frame is configured to:
   collapse and expand in a horizontal direction; and
   collapse and expand in a vertical direction.

8. The data center infrastructure module of claim 6, wherein the first and second set of data center infrastructure components comprise one or more of:
   a power distribution infrastructure component;
   a networking infrastructure component;
   a lighting infrastructure component;
   a fire suppression infrastructure component;
   a building management system infrastructure component;
   an air containment infrastructure component;
   an air distribution infrastructure component; or
   a cooling fluid distribution infrastructure component.

9. The data center infrastructure module of claim 6, further comprising:
   a plurality of air containment panels coupled to the collapsible frame, wherein the collapsible frame and air containment panels are configured to enable the air containment panels to fold into a collapsed arrangement and expand into an expanded arrangement.

10. The data center infrastructure module of claim 6, further comprising:
    a plurality of air containment panels coupled to the collapsible frame, wherein the air containment panels are configured to translate relative to one another between a collapsed arrangement and an expanded arrangement.

11. The data center infrastructure module of claim 6, wherein the data center infrastructure module is configured to span a full length of a data center aisle of a data center, and wherein the data center infrastructure module further comprises:
    connectors for the first set of data center infrastructure components and connectors for the second set of data center infrastructure components, wherein the connectors for the first and second sets of data center infrastructure components are configured to couple with respective data center infrastructure connectors of the data center at a same end of a data center aisle in which the data center infrastructure module is positioned.

12. The data center infrastructure module of claim 6, wherein the first set of data center infrastructure components comprise power busways coupled to the collapsible frame, and wherein the data center infrastructure module is configured to be shipped to the data center location and installed at the data center location with the power busways coupled to the collapsible frame.

13. The data center infrastructure module of claim 12, wherein the second set of data center infrastructure components comprise networking cables installed in cable trays coupled to the collapsible frame, wherein the data center infrastructure module is configured to be shipped to the data center location and installed at the data center location with the networking cables installed in the cable trays.

14. The data center infrastructure module of claim 13, further comprising:
    an interconnect plate, wherein the networking cables installed in the cable tray are coupled to the interconnect plate, and wherein the interconnect plate is configured to couple with a corresponding interconnect plate of the data center in which the data center infrastructure module is installed.

15. A data center comprising:
    frame structures for data center rows on opposing sides of a data center aisle; and
    a data center infrastructure module positioned in the data center aisle between the frame structures, wherein the data center infrastructure module comprises:
       a collapsible frame; and
       data center infrastructure components coupled to the collapsible frame,
    wherein the data center infrastructure module is configured to be:
       transported to or from the position in the data center aisle between the frame structures in a collapsed state; and
       expanded into an expanded state such that in the expanded state the data center infrastructure module provides data center infrastructure to the data center rows of the data center on the opposing sides of the data center aisle.

16. The data center of claim 15, wherein the data center infrastructure module further comprises:
    an additional support structure member coupled to the collapsible frame, wherein the additional support structure member is configured to be positioned in a second data center aisle of the data center running perpendicular to the data center aisle between the data center rows, and
    wherein the additional support structure member is configured to support data center infrastructure components in the second aisle running perpendicular to the data center aisle between the data center rows.

17. The data center of claim 15 further comprising:
    a vertical lifting device configured to lift the data center infrastructure module.

18. The data center of claim 17 wherein the vertical lifting device comprises:
    a hoist and pulley system, wherein the hoist and pulley system is configured to lift the data center infrastructure module via cables coupled to the collapsible frame; or
    a ball screw lift system configured to lift the data center infrastructure module via rotation of a lifting screw or lifting nut.

19. The data center of claim 18, wherein the frame structures for the data center rows comprise:
    guides for lifting the data center infrastructure module via the hoist and pulley system; and
    safety devices configured to prevent the data center infrastructure module from falling once elevated off of a floor of the data center via the hoist and pulley system.

20. The data center of claim 15, further comprising an additional data center infrastructure module positioned in the data center aisle between the frame structures for the data center rows, wherein:
    the data center infrastructure module spans a length of the data center aisle from a first end of the data center rows towards an intermediate point of the data center rows;
    the additional data center infrastructure module spans a length of the data center aisle from a second end of the data center rows towards the intermediate point of the data center rows;
    the data center infrastructure module is coupled to data center infrastructure systems at the first end of the data center aisle; and
    the additional data center infrastructure module is coupled to additional data center infrastructure systems at the second end of the data center aisle.

21. The data center of claim 20, wherein;
the data center infrastructure module is coupled to the data center infrastructure systems at the first end of the data center aisle via redundant data center infrastructure connections;
the additional data center infrastructure module is coupled to the additional data center infrastructure systems at the second end of the data center aisle via redundant data center infrastructure connections; and
the data center infrastructure module and the additional data center infrastructure module are redundantly coupled to one another via redundant data center infrastructure connections.

* * * * *